United States Patent
Matsunaga et al.

(10) Patent No.: US 7,369,169 B2
(45) Date of Patent: May 6, 2008

(54) MOS-TYPE SOLID-STATE IMAGING APPARATUS

(75) Inventors: Yoshiyuki Matsunaga, Kamakura (JP); Shinji Ohsawa, Ebina (JP); Nobuo Nakamura, Fuchu (JP); Hirofumi Yamashita, Ota-ku (JP); Hiroki Miura, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 810 days.

(21) Appl. No.: 10/916,409

(22) Filed: Aug. 12, 2004

(65) Prior Publication Data

US 2005/0012839 A1 Jan. 20, 2005

Related U.S. Application Data

(60) Division of application No. 09/733,917, filed on Dec. 12, 2000, now Pat. No. 6,795,121, which is a division of application No. 09/022,124, filed on Feb. 11, 1998, now Pat. No. 6,239,839, which is a continuation of application No. PCT/JP96/02280, filed on Aug. 12, 1996.

(30) Foreign Application Priority Data

| Aug. 11, 1995 | (JP) | ................................. 7-206140 |
| Aug. 11, 1995 | (JP) | ................................. 7-206143 |
| Aug. 11, 1995 | (JP) | ................................. 7-206144 |
| Mar. 15, 1996 | (JP) | ................................. 8-059845 |

(51) Int. Cl.
*H04N 5/335* (2006.01)

(52) U.S. Cl. ..................... 348/308; 348/300

(58) Field of Classification Search ................. 348/300, 348/308

See application file for complete search history.

(56) References Cited

U.S. PATENT DOCUMENTS 4,556,910 A 12/1985 Tisue (Continued)

FOREIGN PATENT DOCUMENTS

| JP | 61-70874 | 4/1986 |
| JP | 61-154063 | 7/1986 |
| JP | 62-213485 | 9/1987 |
| JP | 63-93282 | 4/1988 |
| JP | 63-116458 | 5/1988 |
| JP | 1-154678 | 6/1989 |

(Continued)

*Primary Examiner*—Tuan Ho
(74) *Attorney, Agent, or Firm*—Oblon, Spivak, McClelland, Maier & Neustadt, P.C.

(57) ABSTRACT

An MOS-type solid-state imaging apparatus includes an imaging region formed by two-dimensionally arranging unit cells serving as photoelectric conversion portions on a semiconductor substrate, a plurality of vertical address lines arranged in a row direction of the imaging region to select a row of unit cells to be addressed, a plurality of vertical signal lines arranged in a column direction of the imaging region to read out signals from the unit cells in each column, a plurality of load transistors each connected to one end of each of the vertical signal lines, and a plurality of horizontal selection transistors each connected to the other end of each of the vertical signal lines. In this apparatus, each unit cell includes a photodiode serving as a photoelectric conversion portion, an amplification transistor having a gate to which an output from the photodiode is supplied, and a source and a drain respectively connected to the vertical signal line and the vertical address line, an address capacitor connected between the gate of the amplification transistor and the vertical address line, and a reset transistor connected in parallel with the address capacitor.

17 Claims, 33 Drawing Sheets

U.S. PATENT DOCUMENTS

| | | | |
|---|---|---|---|
| 4,809,075 A | 2/1989 | Akimoto et al. | |
| 4,819,070 A | 4/1989 | Hynecek | |
| 4,942,474 A | 7/1990 | Akimoto et al. | |
| 5,043,820 A | 8/1991 | Wyles et al. | |
| 5,122,881 A | 6/1992 | Nishizawa et al. | |
| 5,144,447 A | 9/1992 | Akimoto et al. | |
| 5,146,339 A | 9/1992 | Shinohara et al. | |
| 5,172,249 A | 12/1992 | Hashimoto | |
| 5,322,994 A | 6/1994 | Uno | |
| 5,572,257 A * | 11/1996 | Conrads et al. | 348/308 |
| 5,693,932 A * | 12/1997 | Ueno et al. | 250/208.1 |
| 5,717,458 A | 2/1998 | Yonemoto | |
| 5,719,626 A | 2/1998 | Yoneyama et al. | |
| 5,796,431 A * | 8/1998 | Yonemoto | 348/308 |
| 6,456,326 B2 | 9/2002 | Fossum et al. | |

FOREIGN PATENT DOCUMENTS

| | | |
|---|---|---|
| JP | 2-174378 | 7/1990 |
| JP | 3-135175 | 6/1991 |
| JP | 4-4681 | 1/1992 |
| JP | 4-348566 | 12/1992 |
| JP | 5-207220 | 8/1993 |
| JP | 5-207376 | 8/1993 |
| JP | 5-227487 | 9/1993 |
| JP | 6-98080 | 4/1994 |
| JP | 6-189199 | 7/1994 |
| JP | 7-30086 | 1/1995 |
| JP | 7-231076 | 8/1995 |
| JP | 8-251485 | 9/1996 |
| JP | 9-46596 | 2/1997 |
| WO | WO97/07629 | 2/1997 |

* cited by examiner

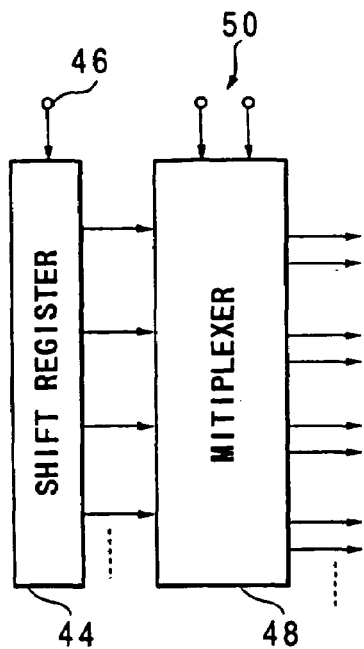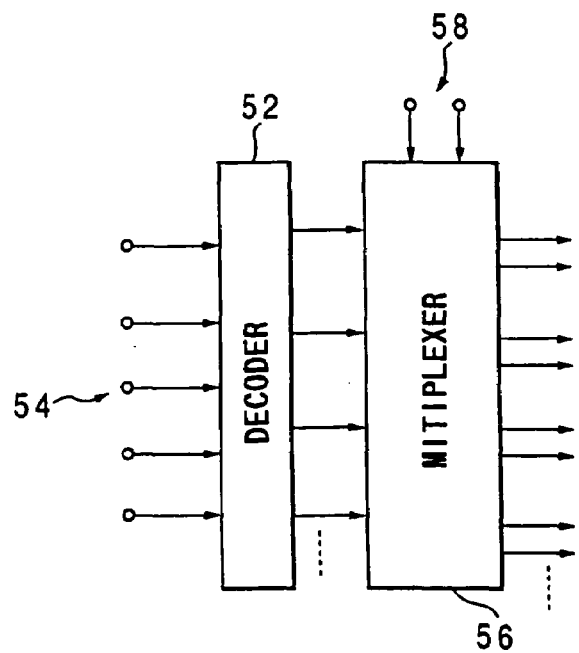
FIG.4        FIG.5
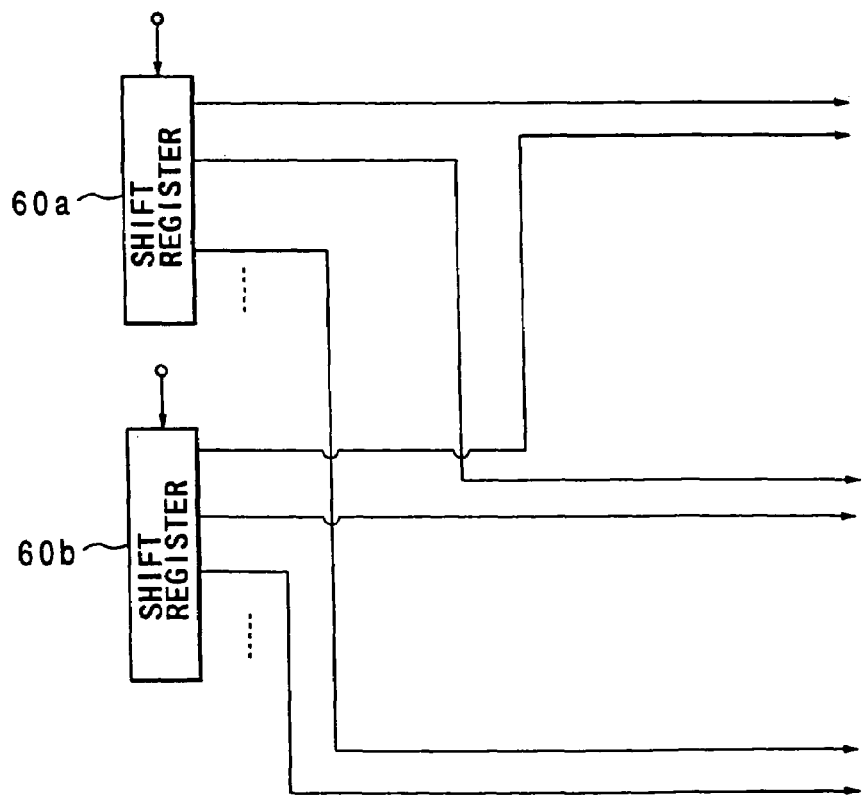
FIG.6

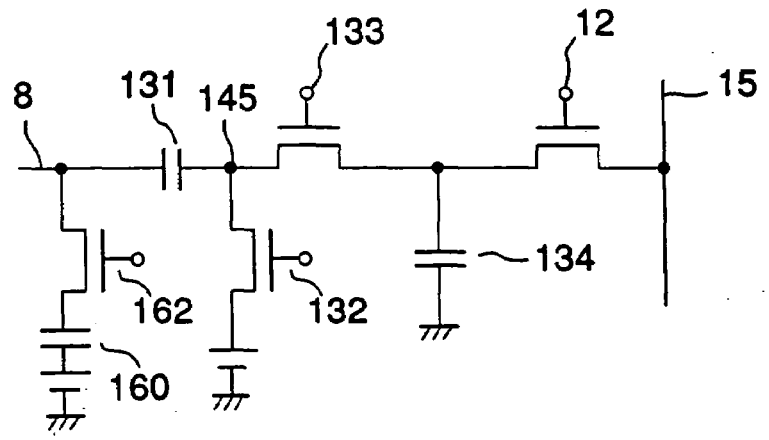
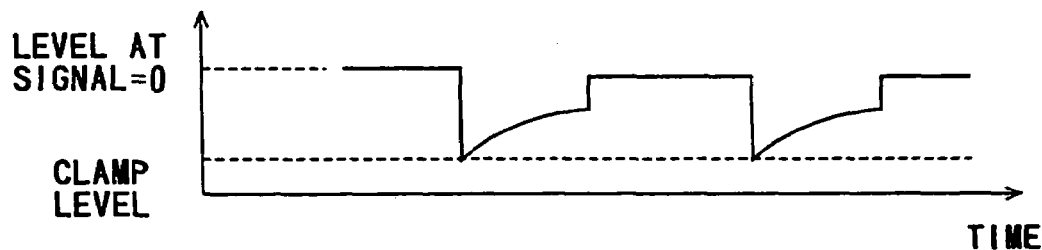
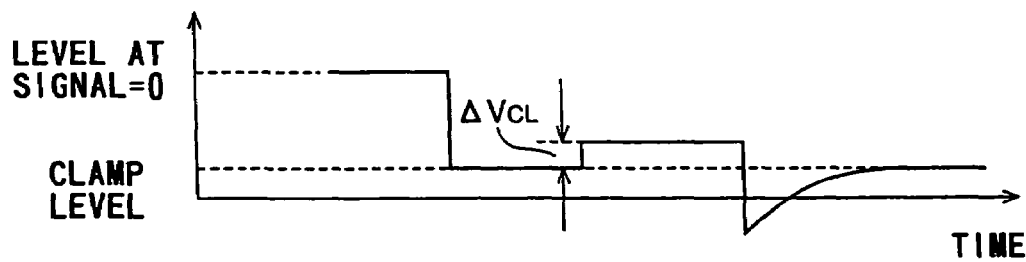
FIG.28

MOS-TYPE SOLID-STATE IMAGING APPARATUS

CROSS-REFERENCE TO RELATED DOCUMENTS

The present patent document is a divisional of U.S. application Ser. No. 09/733,917 filed on Dec. 12, 2000, which is a divisional of U.S. application Ser. No. 09/022,124, filed on Feb. 11, 1998, now U.S. Pat. No. 6,239,839, which is a continuation application of Application No. PCT/JP96/02280, filed on Aug. 12, 1996, now abandoned; and in turn claims priority to JP 7-206140, JP 7-206143, JP 7-206144 filed on Aug. 11, 1995, and JP 8-059845, filed on Mar. 15, 1996, the entire contents of each of which are hereby incorporated herein by reference.

BACKGROUND OF THE INVENTION

The present invention relates to a solid-state imaging apparatus using an amplification-type MOS sensor for amplifying signal charges within cells.

Recently, compact video cameras and high-resolution, high-vision solid-state imaging apparatuses have been developed. Strong demands have arisen for not only compact cameras and solid-state imaging apparatuses but also low-power-consumption, low-voltage solid-state imaging apparatuses as portable cameras and personal computer cameras.

As the chip size of a solid-state imaging apparatus decreases, however, the amount of signal charge to be processed decreases due to micropatterning. As a result, the dynamic range of the solid-state imaging apparatus narrows, and hence a clear, high-resolution video cannot be obtained. In addition, since many power supply voltages having two, three, or more values are used, a simple system cannot be coped with in terms of camera system configuration and handling. That is, for application to portable cameras and personal computer cameras, a solid-state imaging apparatus which attains a high S/N ratio and uses a single power supply, and also attains reductions in power consumption and voltage is required.

To solve this problem, several amplification-type solid-state imaging apparatuses using transistors have been proposed. These solid-state imaging apparatuses are designed to cause transistors to amplify signals detected by photodiodes in the respective cells, and are characterized by having a high sensitivity.

FIG. 1 is a circuit diagram showing the arrangement of a conventional solid-state imaging apparatus using an amplification-type MOS sensor. Unit cells P0-i-j corresponding to pixels are arranged in the form of a two-dimensional matrix. Although FIG. 1 shows only a 3×3 matrix, the actual apparatus has several thousand cells×several thousand cells. Reference symbol i denotes a variable in the horizontal (row) direction; and j, a variable in the vertical (column) direction. Each unit cell P0-i-j is constituted by a photodiode 1-i-j for detecting incident light, an amplification transistor 2-i-j having a gate to which the cathode of the photodiode 1-i-j is connected and designed to amplify the detection signal, a vertical selection transistor 3-i-j connected to the drain of the amplification transistor 2-i-j to select a horizontal line for reading out the signal, and a reset transistor 4-i-j connected to the cathode of the photodiode 1-i-j to reset the signal charge. The source of the vertical selection transistor 3-i-j and the source of the reset transistor 4-i-j are commonly connected to a drain voltage terminal.

Vertical address lines 6-1, 6-2, . . . horizontally extending from a vertical address circuit 5 are connected to the gates of vertical selection transistors 3-1-1, . . . of the unit cells in the respective rows to determine horizontal lines for reading out signals. Similarly, reset lines 7-1, 7-2, . . . horizontally extending from the vertical address circuit 5 are connected to the gates of reset transistors 4-1-1, . . . in the respective rows.

The sources of amplification transistors 2-1-1, . . . of the unit cells in the respective rows are connected to vertical signal lines 8-1, 8-2, . . . arranged in the column direction. Each of load transistors 9-1, 9-2, . . . is connected to one end of a corresponding one of the vertical signal lines 8-1, 8-2, . . . . A signal output terminal (horizontal signal line) 15 is connected to the other end of each of the vertical signal lines 8-1, 8-2, . . . through horizontal selection transistors 12-1, 12-2, . . . which are driven by horizontal address pulses output from a horizontal address circuit 13.

FIG. 2 is a timing chart showing the operation of this device. When a high-level address pulse is applied to the vertical address line 6-1, only the vertical selection transistors 3 in this line are turned on. As a result, a source follower circuit is constituted by the amplification transistor 2 and the load transistor 9 in this line.

With this operation, the gate voltage of the amplification transistor 2, i.e., almost the same voltage as that of the photodiode 1, appears on the vertical signal line 8.

Horizontal address pulses are sequentially applied from the horizontal address circuit 13 to the horizontal selection transistors 12-1, 12-2, . . . to sequentially output signals corresponding to lines (rows) from the signal output terminal 15. When the signal corresponding to one line is completely read out, a high-level reset pulse is applied to the reset line 7-1 to turn on the reset transistor 4 in this line so as to reset the signal charge.

By sequentially performing this operation for the subsequent lines, all the signals in the two-dimensional matrix can be read out. In this case, a voltage corresponding to almost the same change in the potential of the photodiode 1 appears on the vertical signal line 8. If the capacitances of the photodiode 1 and the vertical signal line 8 are respectively represented by Cs and Cv, the signal charge is amplified Cv/Cs times. In general, Cv is much larger than Cs.

In a solid-state imaging apparatus using an amplification-type MOS sensor of this type, the following problem is posed. As shown in FIG. 1, each unit cell requires at least three transistors, i.e., the amplification transistor 2, the vertical selection transistor 3, and the reset transistor 4. As described above, since the number of transistors constituting each cell is large, this arrangement is not suited for the miniaturization of cells. Although each cell of an MOS-type sensor other than the amplification type is constituted only by a photodiode and a transistor, the sensitivity of the MOS type sensor other than the amplification type is lower than that of the amplification type.

It is an object of the present invention to provide an MOS-type solid-state imaging apparatus which allows a reduction in size.

BRIEF SUMMARY OF THE INVENTION

According to the present invention, there is provided an MOS-type solid-state imaging apparatus comprising unit cells arranged in an array, means for selecting one of the unit cells; selection lines connected between the selecting means and the unit cells of each row; and vertical signal lines to which outputs from the unit cells in each column are supplied, wherein each of the unit cells comprises a photoelectric conversion portion; an amplification transistor having a gate to which an output from the photoelectric conversion portion is supplied, a source connected to the vertical signal line, and a drain connected to the selection line; an address capacitor connected between the gate of the amplification transistor and the selection line; and a reset transistor connected in parallel with the address capacitor.

According to the present invention, there is provided another MOS-type solid-state imaging apparatus comprising unit cells arranged in an array; means for selecting one of the unit cells; selection lines connected between the selecting means and the unit cells of each row; and vertical signal lines to which outputs from the unit cells in each column are supplied, wherein each of the unit cells comprises a photoelectric conversion portion; an amplification transistor having a gate to which an output from the photoelectric conversion portion is supplied, a source connected to the vertical signal line, and a drain connected to the selection line; and a reset transistor connected between the gate of the amplification transistor and the selection line, and wherein the amplification transistor has a short channel effect that when a selection voltage is applied to the selection line, a channel potential under the gate changes to a voltage not less than a signal voltage of the photoelectric conversion portion.

According to the present invention, there is provided a further MOS-type solid-state imaging apparatus comprising unit cells arranged in an array; means for selecting one of the unit cells; selection lines connected between the selecting means and the unit cells of each row; and vertical signal lines to which outputs from the unit cells in each column are supplied, wherein each of the unit cells comprises a photoelectric conversion portion; an amplification transistor having a gate to which an output from the photoelectric conversion portion is supplied, a source connected to the vertical signal line, and a drain connected to the selection line; and a reset transistor connected between the gate of the amplification transistor and the selection line, and wherein a switch circuit which is turned on by the selecting means is connected between the selecting means and the selection line.

According to the present invention, there is provided a still another MOS-type solid-state imaging apparatus comprising unit cells arranged in an array; means for selecting one of the unit cells; selection lines connected between the selecting means and the unit cells of each row; and vertical signal lines to which outputs from the unit cells in each column are supplied, wherein each of the unit cells comprises a photoelectric conversion portion; an amplification transistor having a gate to which an output from the photoelectric conversion portion is supplied, a source connected to the vertical signal line, and a drain connected to the selection line; and an address capacitor connected between the gate of the amplification transistor and the selection line, and wherein a negative pulse is applied to the selection line to forward-bias the photoelectric conversion portion through the address capacitor so as to discharge a signal charge from the photoelectric conversion portion.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a view showing a circuit arrangement of a vertical address circuit in the first embodiment;

FIG. 5 is a view showing another circuit arrangement of the vertical address circuit in the first embodiment;

FIG. 6 a view showing still another circuit arrangement of the vertical address circuit in the first embodiment;

FIG. 28 is a potential chart of a noise canceler circuit in the seventh embodiment;

DETAILED DESCRIPTION OF THE INVENTION

MOS-type solid-state imaging apparatuses according to the embodiments of the present invention will be described below with reference to the accompanying drawings.

First Embodiment

Figure 3:
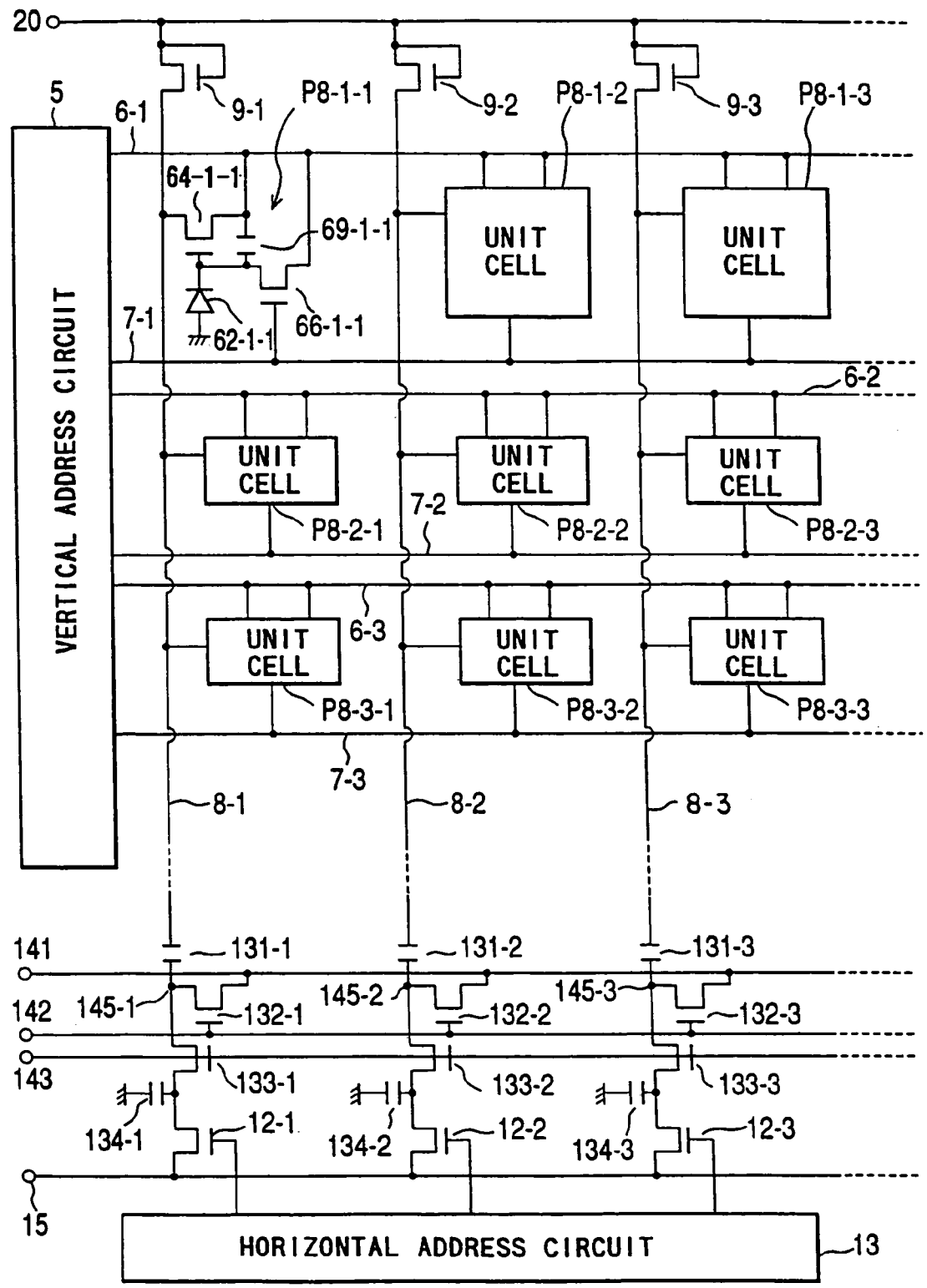
FIG. 3 is a circuit diagram showing the arrangement of an MOS-type solid-state imaging apparatus according to a first embodiment of the present invention.

FIG. 3 shows the arrangement of an MOS-type solid-state imaging apparatus according to a first embodiment of the present invention. Unit cells P8-i-j are arranged in the form of a two-dimensional matrix. Although FIG. 3 shows only a 3×3 matrix, the actual apparatus has several thousand cells× several thousand cells. Reference symbol i denotes a variable in the horizontal (row) direction; and j, a variable in the vertical (column) direction.

The range of applications of the solid-state imaging apparatus of the present invention includes video cameras, electronic still cameras, digital cameras, facsimile apparatuses, copying machines, scanners, and the like.

Each unit cell P8-i-j in this embodiment is constituted by a photodiode 62-i-j for detecting incident light, an amplification transistor 64-i-j having a gate to which the cathode of the photodiode 62-i-j is connected and designed to amplify the detection signal, a reset transistor 66-i-j connected to the cathode of the photodiode 62-i-j (the gate of the amplification transistor 64-i-j) to reset the signal charge, and an address capacitor 69-i-j connected between the drain and gate of the amplification transistor 64-i-j. As described above, in this embodiment, the vertical selection transistors 3-i-j in the prior art (FIG. 1) are omitted, and the address capacitors 69-i-j having the same function as that of the vertical selection transistors 3-i-j are used instead.

Vertical address lines 6-1, 6-2, . . . horizontally extending from a vertical address circuit 5 are connected to the drains of the amplification transistors 64-i-j and the reset transistors 60 of the unit cells in the respective rows to determine horizontal lines for reading out signals. Similarly, reset lines 7-1, 7-2, . . . horizontally extending from the vertical address circuit 5 are connected to the gates of reset transistors 66-i-j of the unit cells in the respective rows.

The sources of the amplification transistors 64-i-j of the unit cells in the respective columns are connected vertical signal lines 8-1, 8-2, . . . arranged in the column direction. Each of load transistors 9-1, 9-2, . . . is connected to one end of a corresponding one of the vertical signal lines 8-1, 8-2, . . . . The gates and drains of the load transistors 9-1, 9-2, . . . are commonly connected to a drain voltage terminal 20.

The other end of each of the vertical signal lines 8-1, 8-2, . . . is connected to a signal output terminal (horizontal signal line) 15 through a corresponding one of clamp capacitors 131-1, 131-2, . . . , a corresponding one of sample/hold transistors 133-1, 133-2, . . . , and a corresponding one of horizontal selection transistors 12-1, 12-2, . . . . The drains of clamp transistors 132-1, 132-2, . . . are connected to the connection points (nodes 145-1, 145-2, . . . ) between the clamp capacitors. 131-1, 131-2, . . . and the sample/hold transistors 133-1, 133-2, . . . . The sources of the clamp transistors 132-1, 132-2, . . . are connected to a common source terminal 141. The gates of the clamp transistors 132-1, 132-2, . . . are connected to a common gate terminal 142. The connection points between the sample/hold transistors 133-1, 133-2, . . . and the horizontal selection transistors 12-1, 12-2, . . . are grounded through sample/hold capacitors 134-1, 134-2, . . . . Address pulses are supplied from a horizontal address circuit 13 to the gates of the horizontal selection transistors 12-1, 12-2, . . . .

The vertical address circuit 5 is a circuit for shifting a plurality of signals, two signals in this case, together, and is realized by one of the circuits shown in FIGS. 4, 5, and 6. In the case shown in FIG. 4, outputs from many output terminals of a shift register 44 for sequentially shifting and outputting an input signal 46 are synthesized with two input signals 50 by a multiplexer 48. In the case shown in FIG. 5, outputs from a decoder 52 for decoding an encoded input 54 are synthesized with two input signals 58 by a multiplexer 56. In the case shown in FIG. 6, the outputs of two shift registers 60a and 60b are synthesized into control signal lines in the respective rows.

Figure 7:
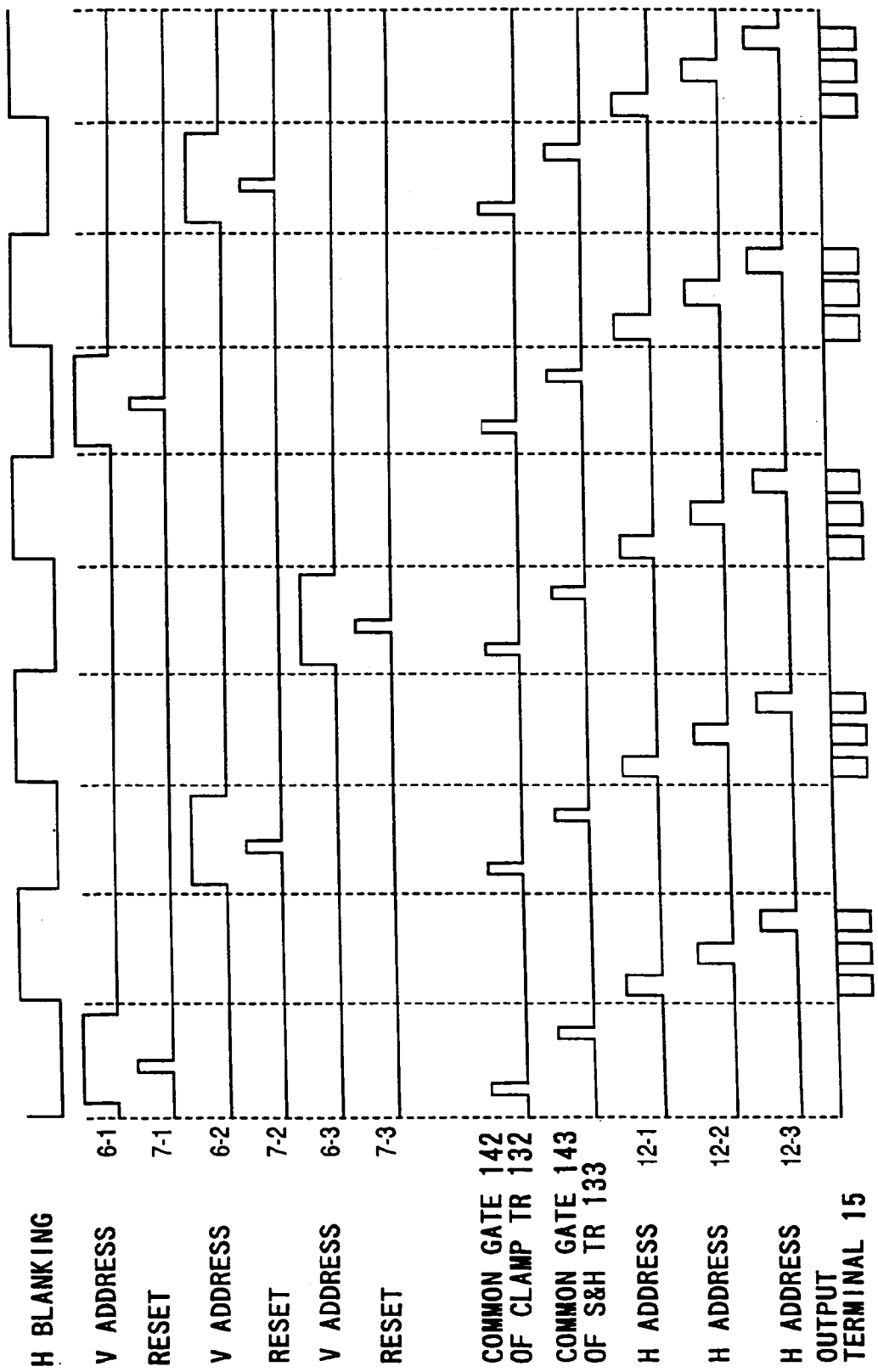
FIG. 7 is a timing chart showing the operation of the first embodiment.

FIG. 7 is a timing chart showing the operation of this embodiment. When a high-level address pulse is applied to the vertical address line 6-1 in a horizontal blanking interval, the high-level address pulse is supplied to the gate of the amplification transistor 64 of each unit cell connected to this line through the address capacitor 69. As a result, the channel potential under this gate becomes higher than the channel potential under the gate of the amplification transistor 64 of each unit cell connected to each of the remaining lines, and the amplification transistor 64 of each unit cell connected to this line is turned on. A source follower circuit is therefore formed by the amplification transistor 64 of each cell connected to the vertical address line 6-1 and the load transistor 9. The gate voltage of the amplification transistor 64, i.e., almost the same voltage as that of a photodiode 64, appears on the vertical signal line 8. As described above, only the gate potentials of the amplification transistors 64 of the addressed line appear on the vertical signal lines 8-1, 8-2, . . . , but the gate potentials of the amplification transistors 64 on the remaining lines do not appear. The vertical address lines can therefore be addressed without any vertical selection transistors.

A clamp pulse is applied to the common gate terminal 142 of the clamp transistors 132-1, 132-2, . . . to turn on the clamp transistors 132-1, 132-2, . . . , and the clamp nodes 145-1, 145-2, . . . are set to the same voltage as that of the common source terminal (clamp potential terminal) 141.

After the clamp transistors 132-1, 132-2, . . . are turned off, a high-level reset pulse is applied to the reset line 7-1 to turn on reset transistors 66-1, 66-2, . . . so as to reset the signal charges in the photodiodes 62. As a result, voltages obtained by adding the differences between the voltages of the vertical signal lines 8-1, 8-2, . . . with the signal charges being kept in the photodiodes 62 and those of the vertical signal lines 8-1, 8-2, . . . without the signal charges after the reset operation, to the voltage of the clamp potential terminal 141 respectively appear on the clamp nodes 145-1, 145-2, . . . .

Subsequently, a sample/hold pulse is applied to a common gate 143 of the sample/hold transistors 133-1, 133-2, . . . to turn on the sample/hold transistors 133-1, 133-2, . . . and transfer this signal to the sample/hold capacitors 134-1, 134-2, . . . .

After this operation, a horizontal address pulse is sequentially applied from the horizontal address circuit 13 to the horizontal selection transistors 12-1, 12-2, . . . to sequentially output signals corresponding to lines (rows) from the horizontal signal line 15.

By sequentially performing this operation for the subsequent lines, all the signals in the two-dimensional matrix can be read out.

In general, in the amplification-type MOS solid-state imaging apparatus, since variations in the threshold voltages of the amplification transistors 64 are superimposed on signals, even if the potentials of the photodiodes 62 are the same, the output signals vary. For this reason, when a picked-up image is reproduced, two-dimensional noise (called fixed pattern noise because the noise is fixed to a specific place) due to the threshold variations of the amplification transistors 64 is generated. As described above, however, according to this embodiment, since voltages corresponding to the differences between the voltages set when signal charges are present in the unit cells and the voltages set when no signal charges are present appear on the nodes 145-1, 145-2, . . . finally, the fixed pattern noise due to the threshold variations of the amplification transistors 64 is suppressed. That is, a circuit constituted by the clamp capacitor 131, the clamp transistor 132, the sample/hold transistor 133, and the sample/hold capacitor 134 serves as a noise canceler.

The structure of this embodiment will be described next.

In this embodiment, unit cells P8-1-1, P8-1-2, and peripheral circuits such as the vertical address circuit 5 and the horizontal address circuit 13 are formed on a semiconductor substrate having a p$^+$-type impurity layer formed on a p$^-$-type substrate.

Figures 8A, 8B:
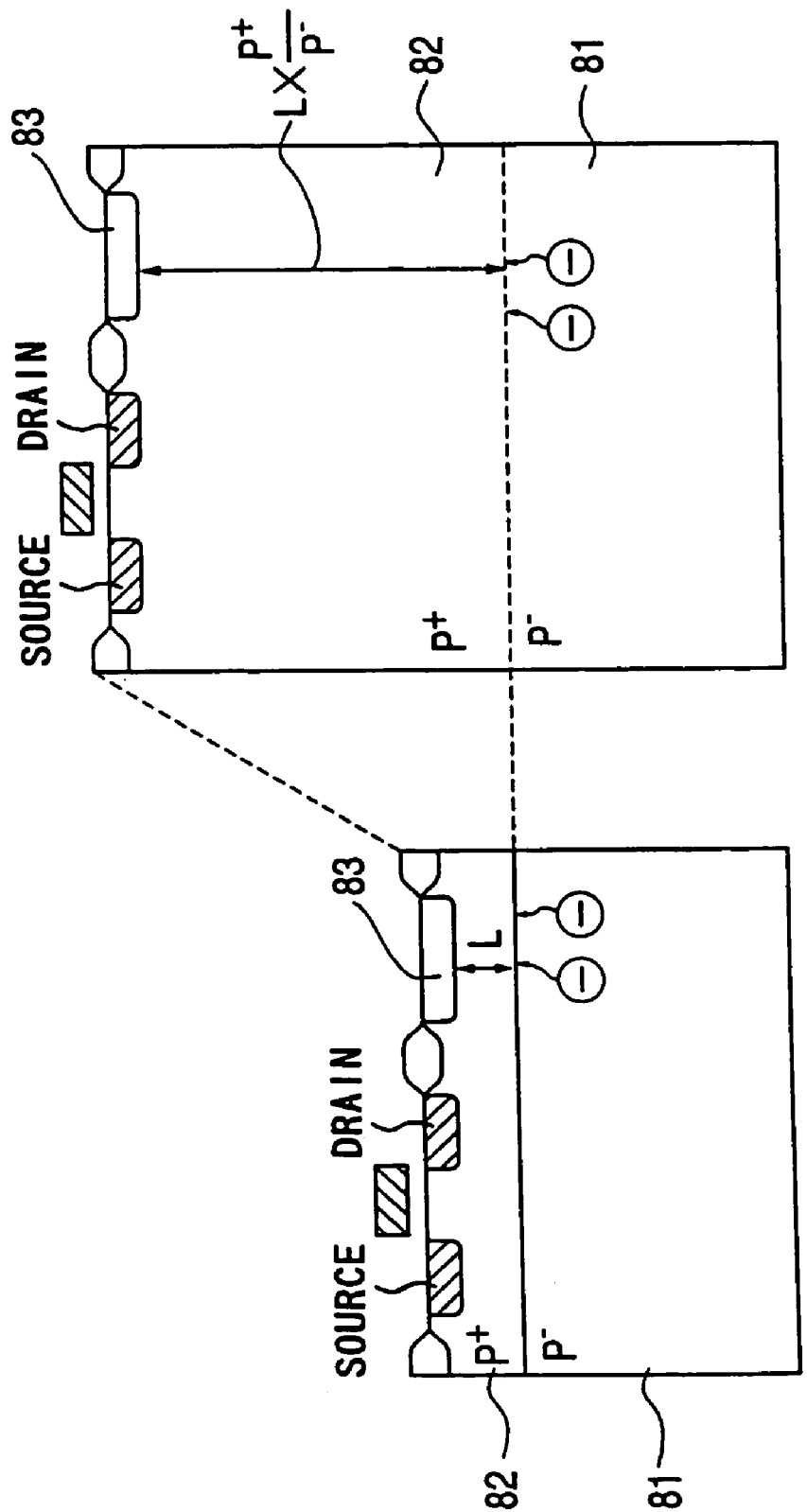
FIGS. 8A and 8B are sectional views showing the device structure of a unit cell in the first embodiment.

FIGS. 8A and 8B are sectional views showing such a semiconductor substrate.

As shown in FIG. 8A, cell elements such as photodiodes 83 are formed on a semiconductor substrate having a p$^+$-type impurity layer 82 formed on a p$^-$-type substrate 81.

With this structure of the semiconductor substrate, the diffusion potential at the p$^-$/p$^+$ boundary can partly prevent a dark current generated in the p$^-$-type substrate 81 from flowing to the p$^+$ layer side.

The result of a detailed analysis of the flows of electrons will be briefly described below. Apparently, a thickness L of the p$^+$-type impurity layer 82 is increased by p$^+$/p$^-$ concentration ratio times, i.e., to L·p$^+$/p$^-$, from the viewpoint of an electron generated on the p$^-$ side.

As shown in FIG. 8B, apparently, the distance from the p$^-$-type substrate 81 as a dark current source to the photodiode 83 is increased p$^+$/p$^-$ times. In addition to the dark current flowing from a deep part of the substrate, a dark current is generated in a depletion layer near the photodiode 83. This dark current generated in the depletion layer is almost equal in magnitude to the dark current flowing from the deep part of the substrate. The thickness of the depletion layer is about 1 μm, and the dark current flowing from the deep part of the substrate also flows from a depth of about 100 μm. This depth is called the diffusion length of an electron in a substrate. The reason why these dark currents are almost equal in magnitude regardless of this thickness difference is that the probability of occurrence of a dark current per unit volume is higher in the depletion layer. In this case, since the dark current generated in the depletion layer cannot be theoretically separated from a signal current, the dark current is reduced by, reducing a component flowing from the deep part of the substrate.

In addition, since cells are formed on the semiconductor substrate having the p$^+$-type impurity layer 72 formed on the p$^-$-type substrate 71, variations in substrate potential due to the dark current can be prevented. The p-type substrate is thick and hence has a high resistance. As will be described later, a noise reduction circuit can be reliably operated.

When the element temperature rises, the component from the deep part of the substrate abruptly increases. This is therefore important. It suffices if the component from the deep part of the substrate is sufficiently smaller than the component generated in the depletion layer. More specifically, it suffices if the dark current from the deep part of the substrate is about 1/10 or less of the dark current from the depletion layer. That is, p$^+$/p$^-$ may be set to 10 to set the component from the deep part of the substrate to about 1/10.

In a semiconductor substrate constituted by an n-type substrate and a p-type well, there is almost no dark current from a deep part of the substrate. To set the dark current to the same level as in such a semiconductor substrate, p$^+$/p$^-$ must be set to 100 to set the dark current from the deep part of the substrate to about 1/100.

In a conventional practical CCD, the impurity concentration of an n-type buried channel is about $10^{16}$ cm$^{-3}$, and the impurity concentration of a p-type layer (p-type substrate in this case) surrounding the buried channel, which is set to stably manufacture the diffusion layer of the buried channel, is about $10^{15}$ cm$^{-3}$.

When $p^+/p^-$ is set to 10, the impurity concentration of the $p^+$-type layer becomes about $10^{16}$ cm$^{-3}$. When $p^+/p^-$ is set to 100, the impurity concentration of the $p^+$-type layer becomes about $10^{17}$ cm$^{-3}$. That is, the impurity concentration of the $p^+$-type layer becomes almost equal to that of the n-type buried channel, i.e., about $10^{16}$ cm$^{-3}$, or becomes higher than that by one order in magnitude.

For this reason, in a conventional practical CCD, the use of a $p^+$-type layer having such an impurity concentration has not been considered. If the impurity concentration of the $p^-$-type layer is decreased, the sheet resistance of the substrate undesirably increases.

In contrast to this, in an amplification-type MOS imaging apparatus, since the buried channel of a CCD is not formed, the value of $p^+/p^-$ can be arbitrarily set to a certain degree without decreasing the impurity concentration of the $p^-$-type layer.

Cells can also be formed by improving the structure of a semiconductor substrate constituted by an n-type substrate and a p-type well by decreasing the resistance of the p-type well.

Figure 9:
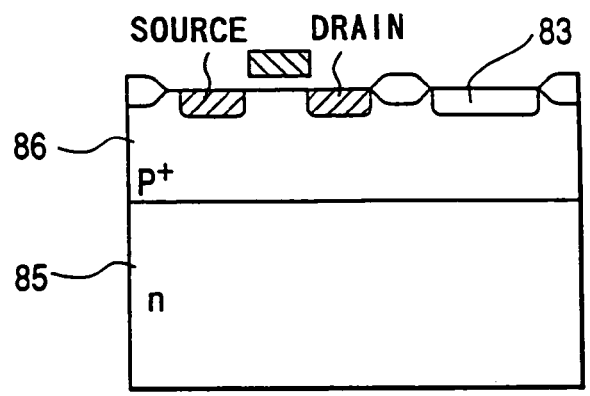
FIG. 9 is a view showing a modification of the semiconductor substrate of a portion of the unit cell in the first embodiment.
Figure 10:
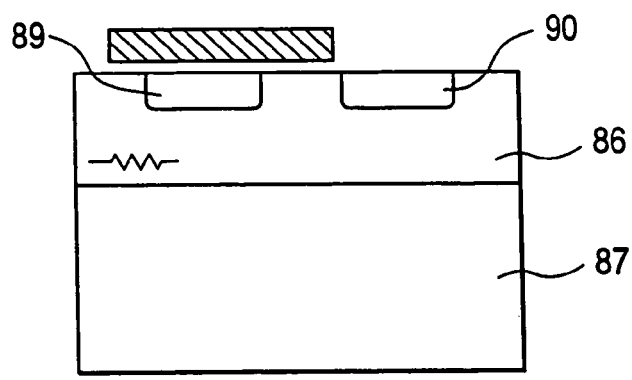
FIG. 10 is a sectional view showing a conventional cell of a CCD-type solid-state imaging apparatus.

FIG. 9 is a sectional view showing a unit cell using a $p^+$-type well 86 having a low sheet resistance on an n-type substrate 85. FIG. 10 is a sectional view showing a unit cell of a CCD.

To stably manufacture a CCD, the impurity concentrations of an n-type substrate 87, a p-type well 86, and an n-type buried channel 89 of the unit cell are respectively set to about $10^{14}$ cm$^{-3}$, about $10^{15}$ cm$^{-3}$, and about $10^{16}$ cm$^{-3}$.

Since the impurity concentration of an n-type photodiode 90 can be arbitrarily set to a certain degree, no many limitations are imposed in terms of manufacture. With the above impurity concentrations, the sheet resistance of the $p^+$-type well 86 is about 100 k$\Omega/\square$. As described above, with such a large value, the noise caused in the CCD is very small.

When a noise reduction circuit is to be used in an amplification-type MOS imaging apparatus, the sheet resistance of the p-type well is very important. This is because, the time taken to suppress disturbances in the potential of the p-type well 86 due to a reset pulse needs to match a system to which this apparatus is to be applied.

According to the NTSC scheme, which is the existing television scheme, the noise reduction circuit is operated in an interval of about 11 [μs], which is a horizontal blanking interval. Disturbances in the potential of the p-type well 86 must be suppressed to about 0.1 [mV] within this interval.

Such a small value as 0.1 [mV] is set because the noise voltage output of the CCD corresponds to this. According to a detailed analysis, to settle the disturbances to a value as small as 0.1 [mV] within the very short time interval of 11 [μs], the sheet resistance of the $p^+$-type well 86 must be set to 1 k$\Omega/\square$ or less. This is about 1/100 the sheet resistance of the conventional CCD.

For this purpose, the impurity concentration of the $p^+$-type well 86 must be increased to about 100 times. Such a concentration cannot be set in the CCD, as described above with reference to the p-type substrate. Furthermore, in the high-vision television scheme, the horizontal blanking interval is 3.77 [μs], and hence the sheet resistance of the $p^+$-type well 86 must be set to 300 k$\Omega/\square$ or less.

As another modification, a semiconductor substrate may be obtained by forming a heavily doped $p^+$-type sandwich layer on a substrate, and forming a lightly doped p-type layer on the surface of the sandwich layer.

Figure 11:
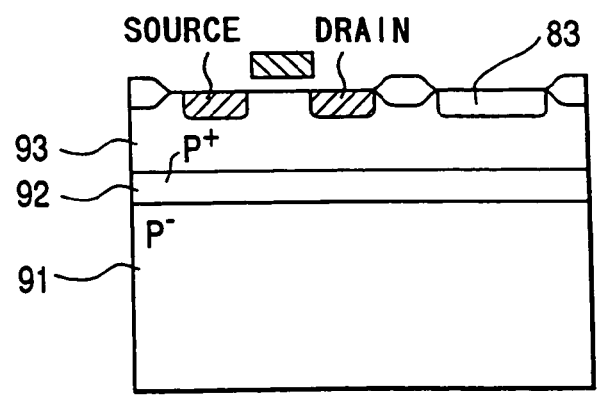
FIG. 11 is a view showing another modification of the semiconductor substrate of the portion of the unit cell in the first embodiment.
Figure 12:
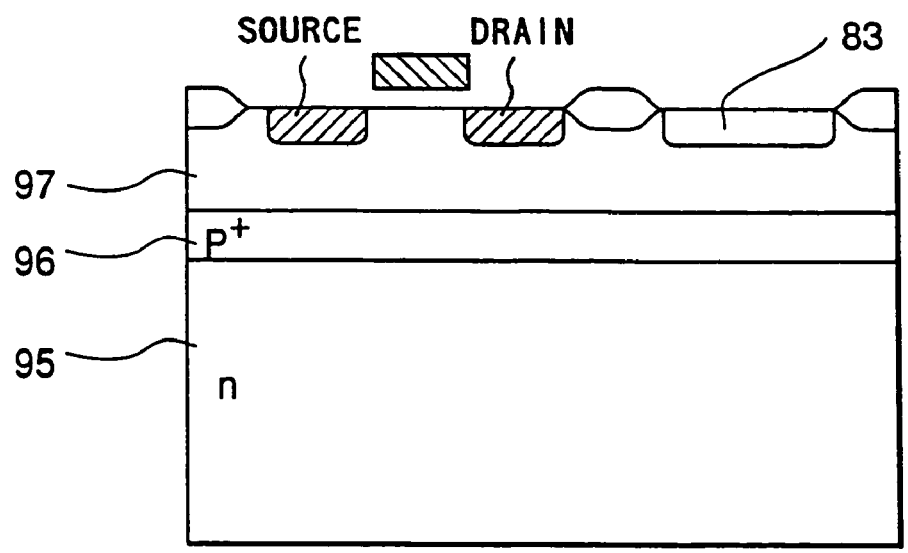
FIG. 12 is a view showing still another modification of the semiconductor substrate of the portion of the unit cell in the first embodiment.

FIG. 11 shows the structure of a semiconductor substrate having a $p^+$-type sandwich layer 92 formed between a $p^-$-type substrate 91 and a p-type layer 93. FIG. 12 shows a semiconductor substrate having a $p^+$-type sandwich layer 96 formed between an n-type substrate 95 and a p-type layer 97.

Such a $p^+$-type sandwich layer can be formed by a high-acceleration megavolt ion implantation apparatus.

In addition to photodiodes 83, transistors, and the like as the constituent elements of unit cells, peripheral circuits such as a horizontal address circuit and a vertical address circuit are also formed on the above p-type layer.

Figure 13:
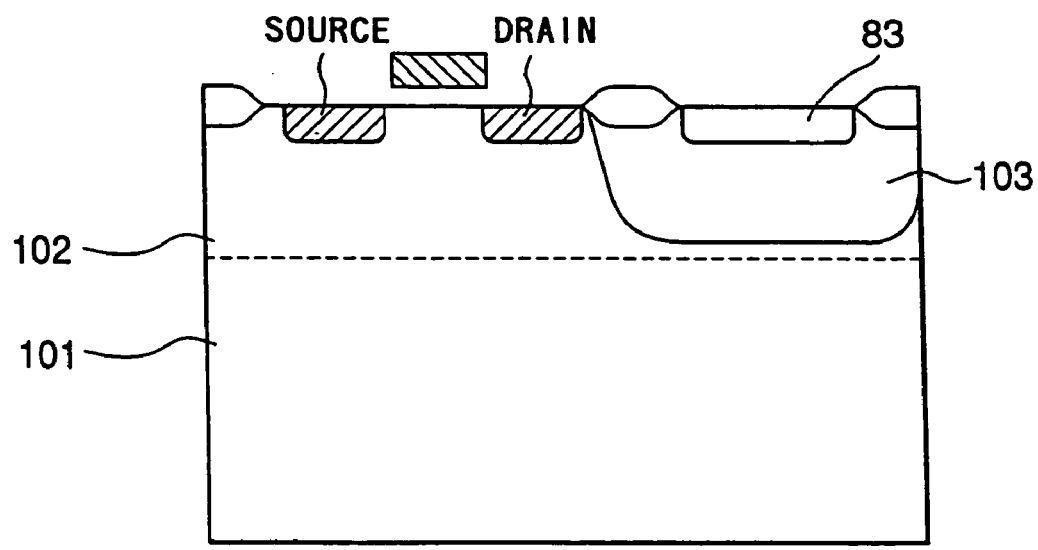
FIG. 13 is a view showing still another modification of the semiconductor substrate of the portion of the unit cell in the first embodiment.

FIG. 13 shows the structure of a semiconductor substrate obtained by surrounding a photodiode 83 with a heavily doped p-type well 103 and forming other portions on an n-type substrate 101 using another p-type well 102.

The use of this structure can prevent a dark current from leaking into the photodiode 83. Note that the semiconductor substrate 101 may be a $p^-$-type substrate.

The impurity concentration of the p-type well, which-forms some or all of the horizontal and vertical address circuits around the cell, is determined in terms of circuit design, and differs from the optimum value of the cell. For this reason, a p-type layer may be formed independently of the p-type well which forms the imaging region.

Figure 14:
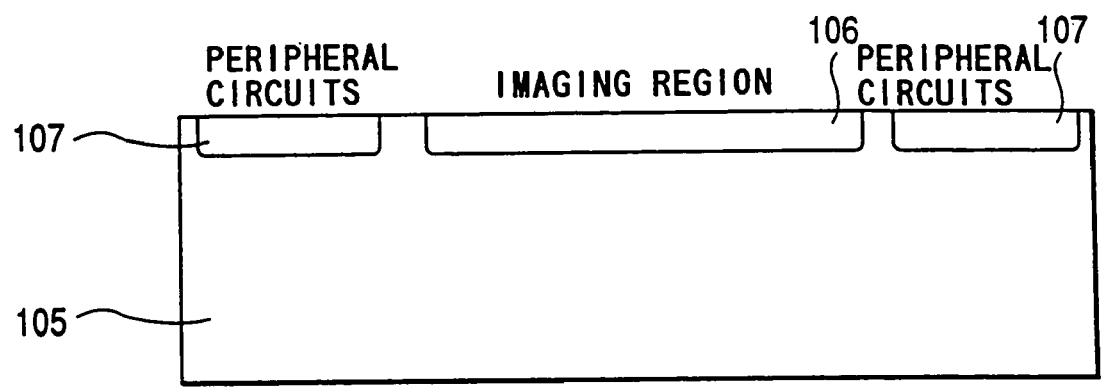
FIG. 14 is a view showing still another modification of the semiconductor substrate of the portion of the unit cell in the first embodiment.

FIG. 14 shows the structure of a semiconductor substrate obtained by forming a p-type well 106, which forms an imaging region, on an n-type substrate 105, and separately forming another p-type well 107, which forms peripheral circuits.

With this structure, p-type wells suited for the respective constituent elements can be formed. Note that the n-type substrate 105 may be a $p^-$-type substrate.

Figure 15:
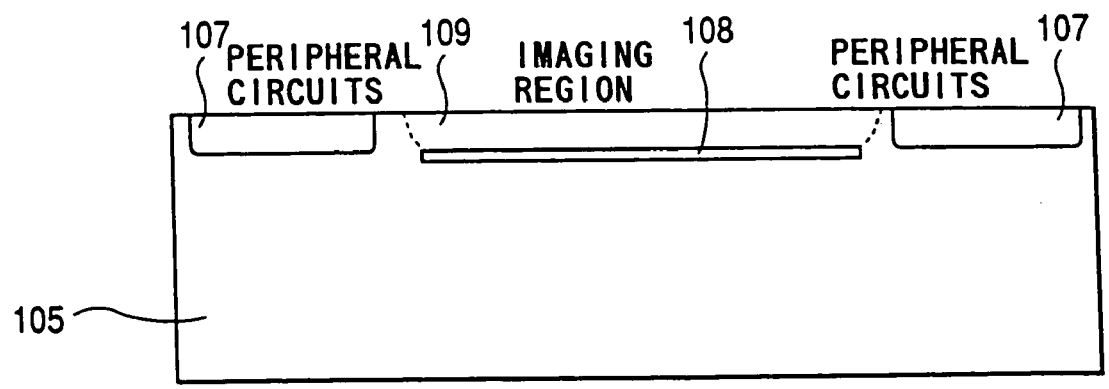
FIG. 15 is a view showing still another modification of the semiconductor substrate of the portion of the unit cell in the first embodiment.

FIG. 15 shows a structure in which a $p^+$-type sandwich layer 108, which forms an imaging region, and a lightly doped p-type layer 109 are formed on an n-type substrate 105, and another p-type well 107 is formed on a peripheral circuit portion.

With this structure, p-type wells suited for the respective constituent elements can be formed, and leakage of a dark current into the photodiode can be prevented. Note that the n-type substrate 105 may be a $p^-$-type substrate.

As described above, according to this embodiment, the source of the amplification transistor 64 is directly connected to the vertical address line 6, and the address capacitor 69 is inserted between the vertical address line 6 and the gate of the amplification transistor 64 instead of a vertical selection transistor. With this structure, the addressed amplification transistor 64 can be turned on, and only its gate potential can be output through the vertical signal line 8. That is, the vertical address line can be addressed without using any vertical selection transistor, and hence a reduction in cell size can be attained.

In addition, since an output from each unit cell is output through the noise canceler, fixed pattern noise due to threshold variations of the amplification transistor of each unit cell can be suppressed.

Furthermore, as a semiconductor substrate on which unit cells are formed, a substrate constituted by a $p^-$-type impurity substrate and a $p^+$-type impurity layer formed thereon is used to reduce a dark current flowing into each unit cell. In addition, since the potential at the substrate surface can be stabilized, the noise reduction circuit can be reliably operated.

Embodiments in which the noise canceler circuit portion of the first embodiment is modified will be described next.

Second Embodiment

Figure 16:
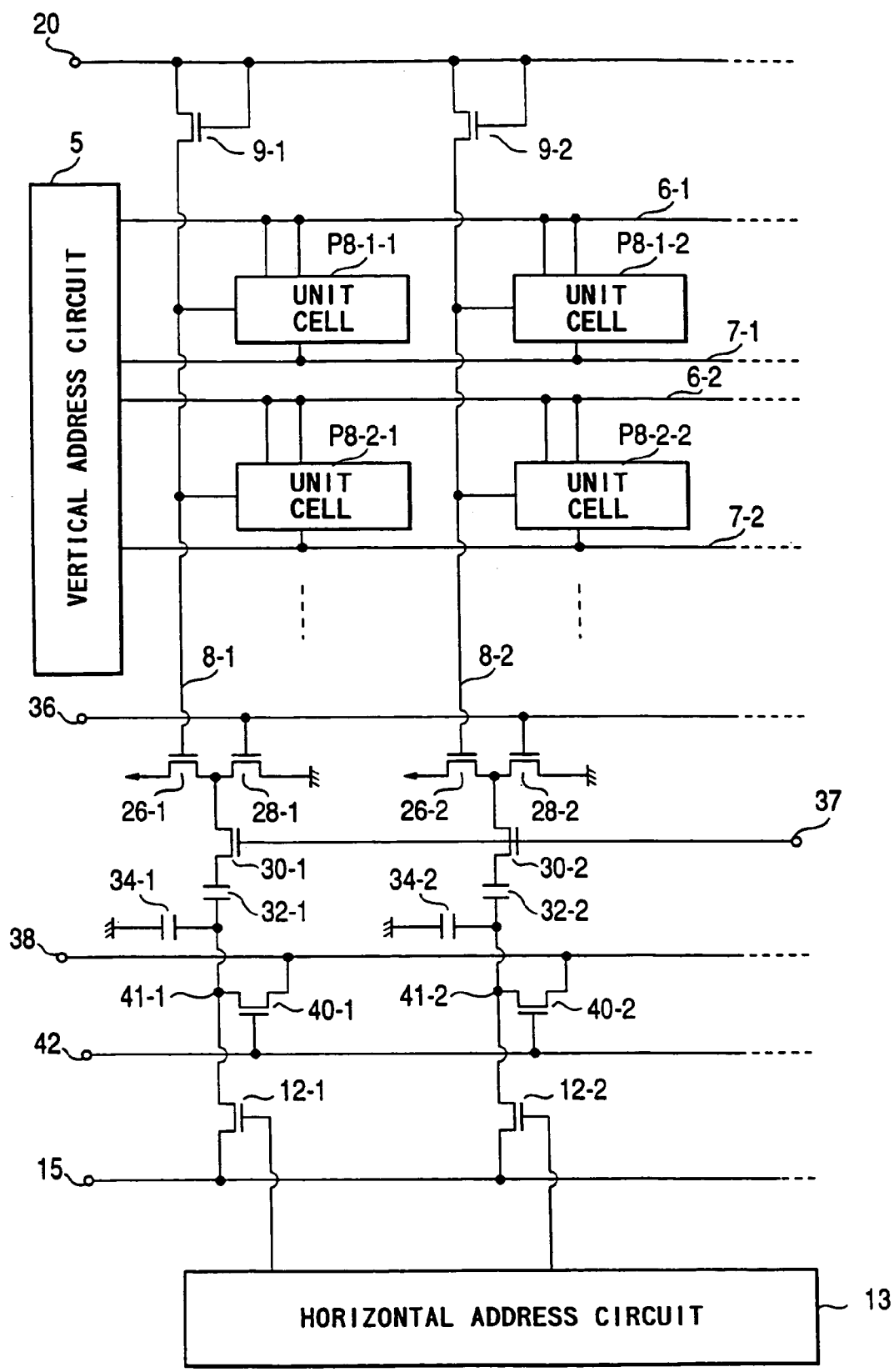
FIG. 16 is a circuit diagram showing the arrangement of an MOS-type solid-state imaging apparatus according to a second embodiment of the present invention.

FIG. 16 is a circuit diagram showing an imaging apparatus using an amplification-type MOS sensor according to a second embodiment of the present invention. The circuit structure of unit cells P8-i-j is the same as that in the first embodiment.

The end of each of vertical signal lines 8-1, 8-2, . . . is connected to the gate of a corresponding one of MOS transistors 26-1, 26-2, . . . . The sources of the MOS transistors 26-1, 26-2, . . . are connected to the drains of MOS transistors 28-1, 28-2, . . . . The MOS transistors 26-1, 26-1, . . . , and 28-1, 28-2, . . . operate as source follower circuits. The gates of the MOS transistors 28-1, 28-2, . . . are connected to a common gate terminal 36.

Each of the connection points between the MOS transistors 26-1, 26-2, . . . and the MOS transistors 28-1, 28-2, . . . is connected to one end of a corresponding one of clamp capacitors 32-1, 32-2, . . . through a corresponding one of sample/hold transistors 30-1, 30-2, . . . . Each of sample/hold capacitors 34-1, 34-2, . . . and each of clamp transistors 40-1, 40-2, . . . are connected in parallel with the other end of a corresponding one of the clamp capacitors 32-1, 32-2, . . . . The other end of each of the sample/hold capacitors 34-1, 34-2, . . . is grounded. The other end of each of the clamp capacitors 32-1, 32-2, . . . is also connected to a signal output terminal (horizontal signal line) 15 through a corresponding one of horizontal selection transistors 12-1, 12-2, . . . .

The structure of this embodiment will be described next. As is apparent from the circuit arrangement in FIG. 16, since the clamp capacitor 32 and the sample/hold capacitor 34 are directly connected to each other and located near, these components may be stacked on the same place, attaining a reduction in unit cell size.

Figure 17:
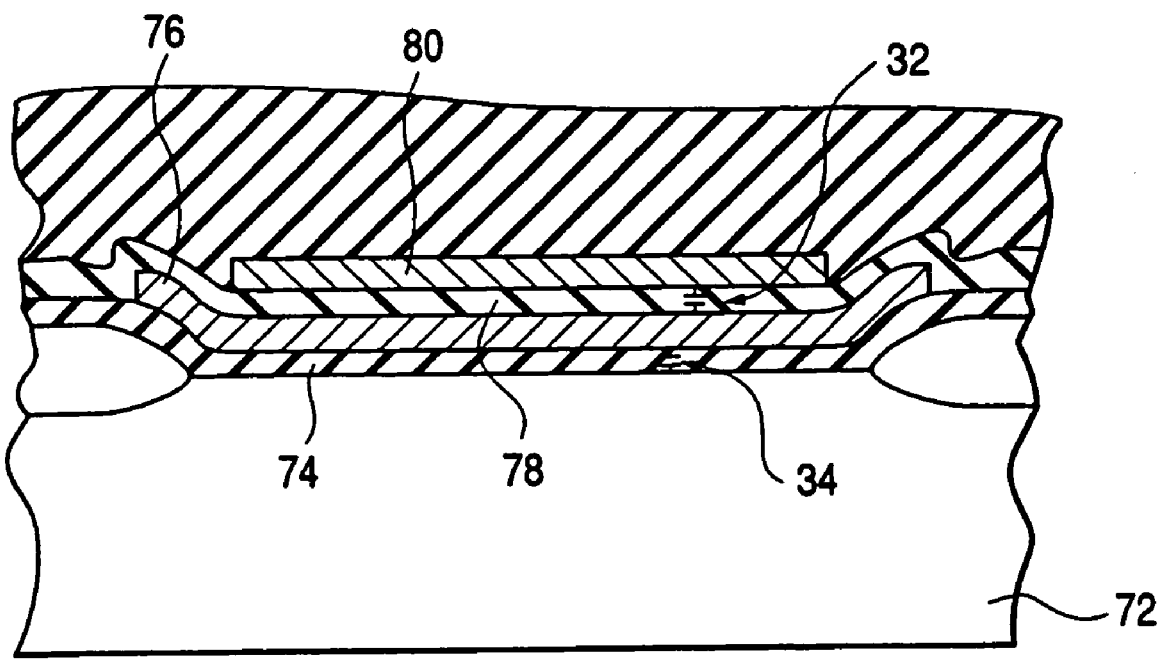
FIG. 17 is a sectional view showing the device structure of a noise canceler portion in the second embodiment.

More specifically, as shown in FIG. 17, a first electrode 76 is formed on a silicon substrate 72 through a first insulating film 74 to form the sample/hold capacitor 34. In addition, a second electrode 80 is formed on the first electrode 76 through a second insulating film 78 to form the clamp capacitor 32.

As is also apparent from FIG. 7, since the first electrode 76 serves as a common electrode, and the clamp capacitor 32 and the sample/hold capacitor 34 are stacked on each other, the same capacitance value as that obtained when these components are separately formed can be obtained with ½ the area.

Figure 18:
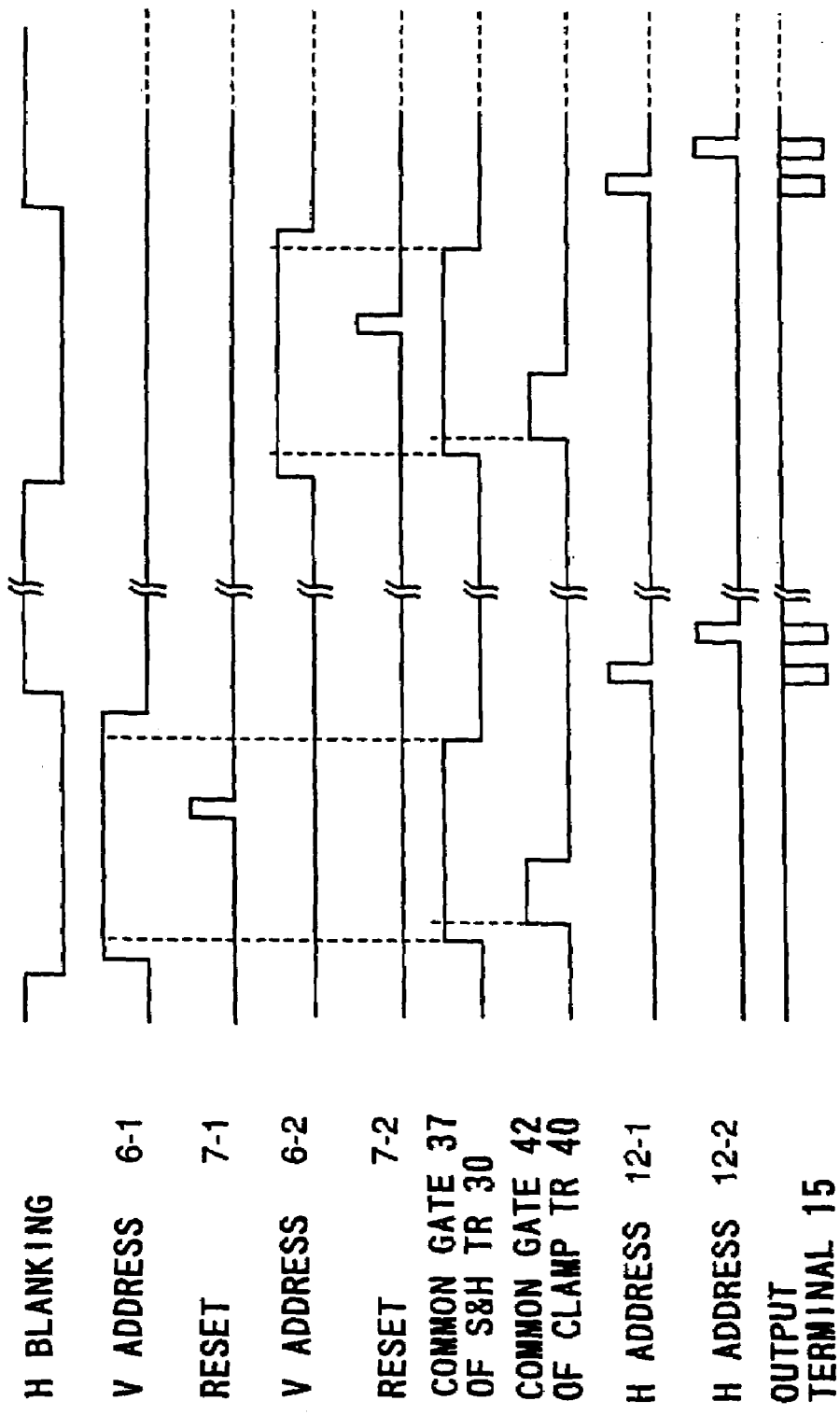
FIG. 18 is a timing chart showing the operation of the second embodiment.

The operation of the MOS-type solid-state imaging apparatus having the above structure will be described next with reference to the timing chart of FIG. 18. Since a common drain voltage terminal 20 of load transistors 9, a common gate terminal 36 of transistors 28 of impedance conversion circuits, and a common source terminal 38 of clamp transistors 40 are DC-driven, their operations are omitted from the timing chart.

When a high-level address pulse is applied to a vertical address line 6-1 in a horizontal blanking interval, amplification transistors 64 of unit cells P8-1-1, P8-1-2, . . . connected to the vertical address line 6-1 are turned on. As a result, the amplification transistors 64 and load transistors 9-1, 9-2, . . . constitute source follower circuits.

A common gate terminal 37 of the sample/hold transistors 30-1, 30-2, . . . is set at high level to turn on the sample/hold transistors 30-1, 30-2, . . . . Thereafter, a common gate terminal 42 of the clamp transistors 40-1, 40-2, . . . is set at high level to turn on the clamp transistors 40-1, 40-2, . . . .

Subsequently, the common gate terminal 42 of the clamp transistors 40-1, 40-2, . . . is set at low level to turn off the clamp transistors 40-1, 40-2, . . . . With this operation, signals plus noise components appearing on the vertical signal lines 8-1, 8-2, . . . are stored in the clamp capacitors 32-1, 32-2, . . . .

When a high-level reset pulse is applied to the reset line 7-1, the reset transistors 66 of the unit cells P8-1-1, P8-1-2, . . . connected to the reset line 7-1 are turned on, and the charges at the input terminals of the output circuits 68 are reset. As a result, only the noise components in which the signal components are reset appear on the vertical signal lines 8-1, 8-2, . . . .

As described above, since the signals plus noise components are stored-in the clamp capacitors 32-1, 32-2, . . . , voltage changes on the vertical signal lines 8-1, 8-2, . . . , i.e., only the signal voltages without fixed pattern noise, obtained by subtracting the noise components from the signal components plus noise components, appear on the clamp nodes 41-1, 41-2, . . . .

The common gate terminal 37 of the sample/hold transistors 30-1, 30-2, . . . is set at low level to turn off the sample/hold transistors 30-1, 30-2, . . . . With this operation, the voltages without noise, appearing on the clamp nodes 41-1, 41-2, . . . , are stored in the sample/hold capacitors 34-1, 34-2, . . . .

By sequentially applying horizontal address pulses to the horizontal selection transistors 12-1, 12-2, . . . , the signals from photodiodes 62, which are stored in the sample/hold capacitors 34-1, 34-2, . . . and contain no noise, are read out from the output terminal (horizontal signal line) 15.

By repeating the above operation for the vertical address lines 6-2, 6-3, . . . in the same manner as described above, the signals in all the cells arranged two-dimensionally can be extracted.

A sequence in the timing chart of FIG. 18 will be described below. The following is the required sequence:

Rise of vertical address pulse, rise of sample/hold pulse, rise of clamp pulse→Fall of clamp pulse→Rise of reset pulse→Fall of reset pulse→Fall of sample/hold pulse→Fall of vertical address pulse.

Although the order of the rise of a vertical address pulse, the rise of a sample/hold pulse, and the rise of a clamp pulse can be arbitrarily set, the above order is preferable.

As described above, according to the operation shown in FIG. 18, since a voltage corresponding to the difference between the voltage set when a signal (plus noise) is present and the voltage set when the gate of the amplification transistor is reset and no signal is present, appears on the clamp node 41, fixed pattern noise caused by threshold variations of the amplification transistor 64 is compensated. That is, a circuit constituted by the clamp transistor 30, the clamp capacitor 31, the sample/hold transistor 40, and the sample/hold capacitor 34 serves as a noise canceler.

Note that the noise cancelers of this embodiment are connected to the vertical signal lines 8 through the impedance conversion circuits 26 and 28 constituted by source follower circuits. That is, the vertical signal lines 8 are connected to the gates of the transistors 26. Since this gate capacitance is very small, the amplification transistors 64 of the cells charge only the vertical signal lines 8-1, 8-2, . . . . For this reason, the CR time constant is small, and a steady state is quickly set. The application timing of a reset pulse can therefore be quickened to perform a noise canceling operation within a short period of time. When a television signal is to be handled, a noise canceling operation must be performed in a horizontal blanking interval. The ability to perform accurate noise cancellation within a short period of time is a great advantage. In addition, since the impedance of the noise canceler apparently remains the same, viewing from the unit cell, in a signal pulse noise output operation and in a noise output operation included in a noise canceling operation, noise can be accurately canceled.

As described above, according to this embodiment, in the noise cancelers, since the clamp capacitors 32-1, 32-2, . . . and the sample/hold capacitors 34 are directly connected to each other and arranged near, they can be stacked on the same place, attaining a reduction in size. In addition, when the noise canceler is viewed from the unit cell, only the gate capacitance can be seen in terms of impedance, and its capacitance is very small. For this reason, noise can be reliably canceled within a short period of time.

Third Embodiment

Figure 19:
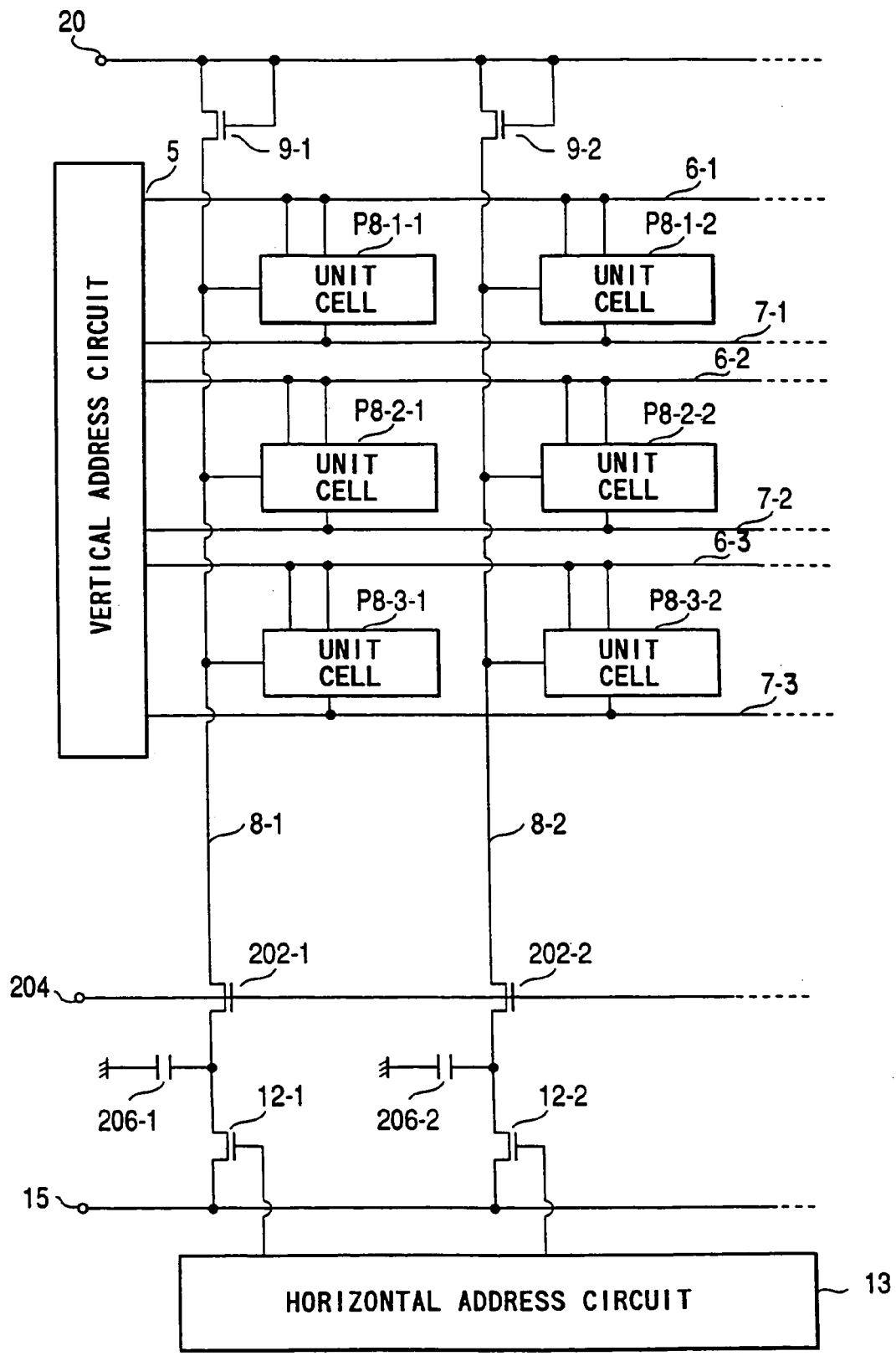
FIG. 19 is a circuit diagram showing the arrangement of an MOS-type solid-state imaging apparatus according to a third embodiment of the present invention.

FIG. 19 is a circuit diagram showing the arrangement of an imaging apparatus using an amplification-type MOS sensor according to a third embodiment of the present invention. The circuit arrangement of each unit cell P8-i-j is the same as that in the first embodiment.

Separation transistors 202-1, 202-2, . . . are connected in series with vertical signal lines 8-1, 8-2, . . . , and amplification capacitors 206-1, 206-2, . . . are arranged between the separation transistors 202-1, 202-2, . . . and horizontal selection transistors 12-1, 12-2, . . . . That is, in this embodiment, no noise cancelers are arranged before the horizontal selection transistors, but amplification capacitors for adjusting amplification factors are arranged instead.

Fourth Embodiment

Figure 20:
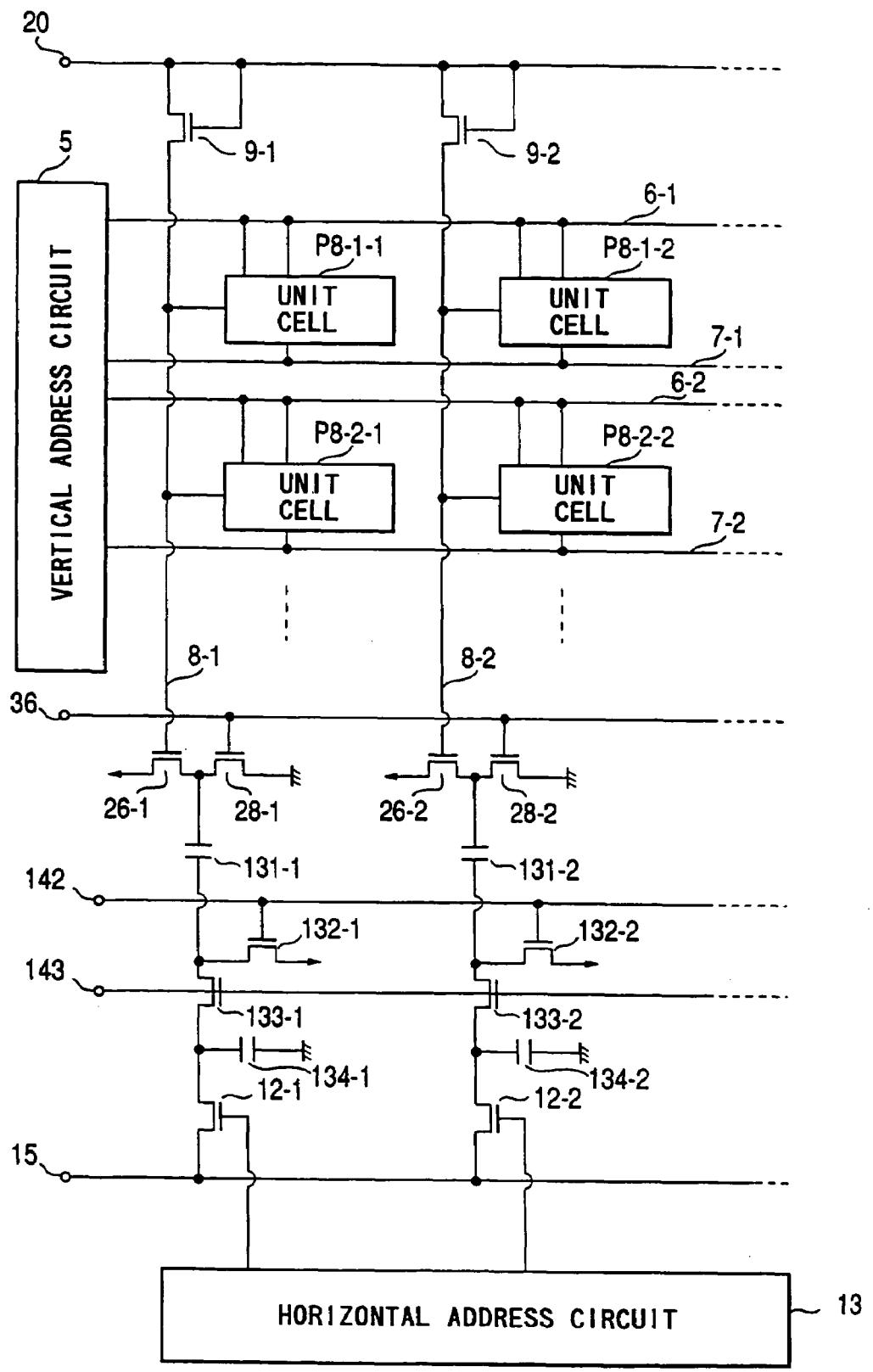
FIG. 20 is a circuit diagram showing the arrangement of an MOS-type solid-state imaging apparatus according to a fourth embodiment of the present invention.

FIG. 20 is a circuit diagram showing the arrangement of an imaging apparatus using an amplification-type MOS sensor according to a fourth embodiment of the present invention. The circuit arrangement of each unit cell P8-i-j is the same as that in the first embodiment.

In the fourth embodiment, the impedance conversion circuits of the second embodiment are connected to the noise canceler circuits of the first embodiment. Note that the common source of each clamp transistor 132 is DC-driven in this embodiment.

Fifth Embodiment

Figure 21:
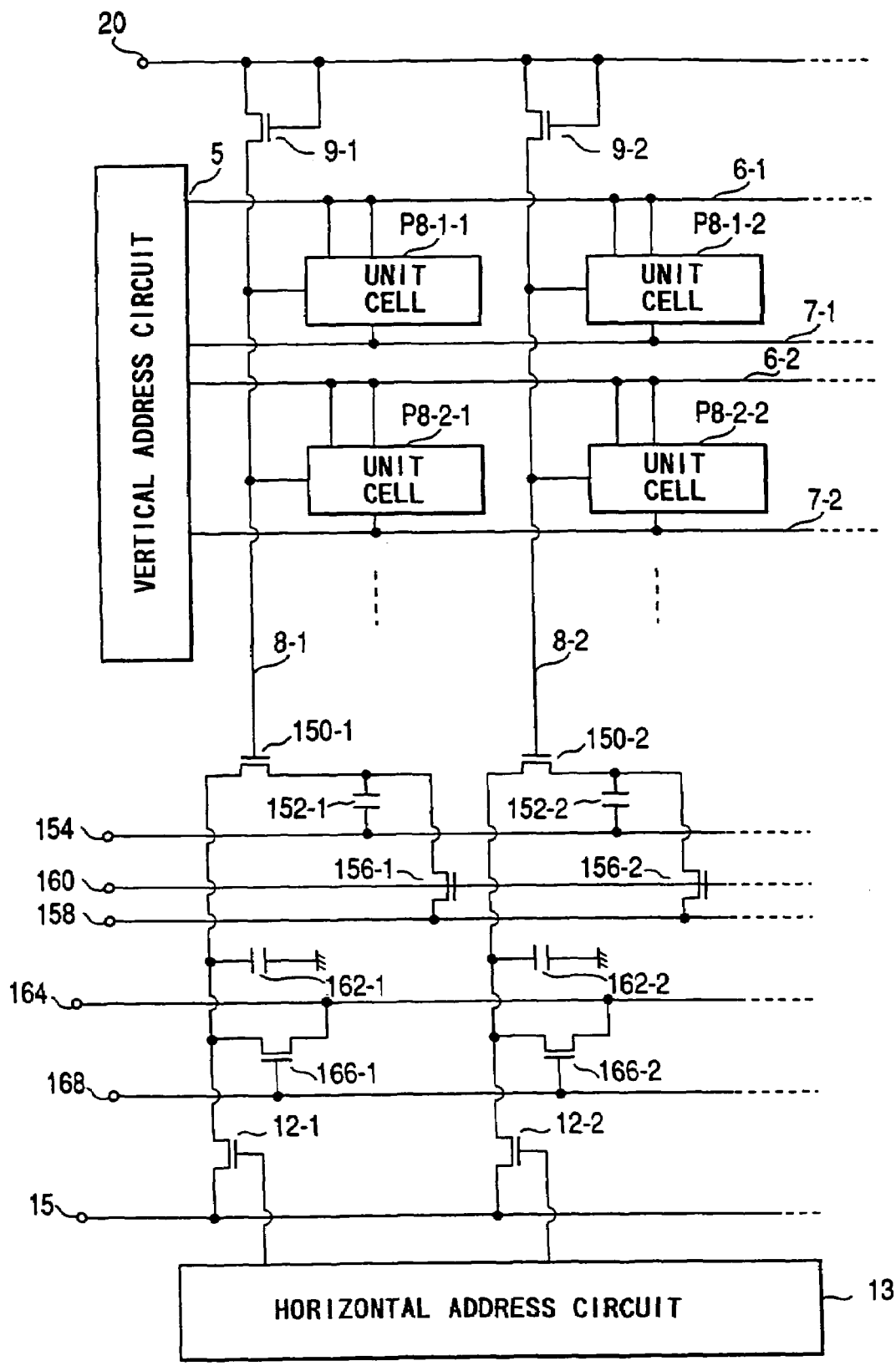
FIG. 21 is a circuit diagram showing the arrangement of an MOS-type solid-state imaging apparatus according to a fifth embodiment of the present invention.

FIG. 21 is a circuit diagram showing the arrangement of an imaging apparatus using an amplification-type MOS sensor according to a fifth embodiment of the present invention. The circuit arrangement of each unit cell P8-i-j is the same as that in the first embodiment.

The end portions of vertical signal lines 8-1, 8-2, . . . on the opposite side to load transistors 9-1, 9-2, . . . are respectively connected to the gates of slice transistors 150-1, 150-2, . . . . One end of each of slice capacitors 152-1, 152-2, . . . is connected to the source of a corresponding one of the slice transistors 150-1, 150-2, . . . . The other end of each of the slice capacitors 152-1, 152-2, . . . is connected to a slice pulse supply terminal 154. To reset the source potentials of the slice transistors 150-1, 150-2, . . . , slice reset transistors 156-1, 156-2, . . . are arranged between the sources of the slice transistors and the slice power supply terminal 158. A slice reset terminal 160 is connected to the gates of the slice reset transistors 156-1, 156-2, . . . .

Slice charge transfer capacitors 162-1, 162-2, . . . are connected to the drains of the slice transistors 150-1, 150-2, . . . . To reset the drain potentials of the slice transistors 150-1, 150-2, . . . , drain reset transistors 166-1, 166-2, . . . are arranged between the drains of the slice transistors and a storage drain power supply terminal 164. The drain reset terminal 168 is connected to the gates of the drain reset transistors 166-1, 166-2, . . . . In addition, the drains of the slice transistors 150-1, 150-2, . . . are connected to a signal output terminal 15 through horizontal selection transistors 12-1, 12-2, . . . which are driven by horizontal address pulses supplied from the horizontal address circuit 13.

As described above, the arrangement of each unit cell P8-i-j of the CMOS sensor in the fifth embodiment is the same as that in the first embodiment shown in FIG. 3, but the arrangement of the noise canceler differs from that in the first embodiment. The noise cancelers in the fifth embodiment are characterized in that voltages appearing on the vertical signal lines 8-1, 8-2, . . . are converted into charges through the gate capacitances of the slice transistors 150, and noise is suppressed by performing subtraction in the charge domains.

Figure 22:
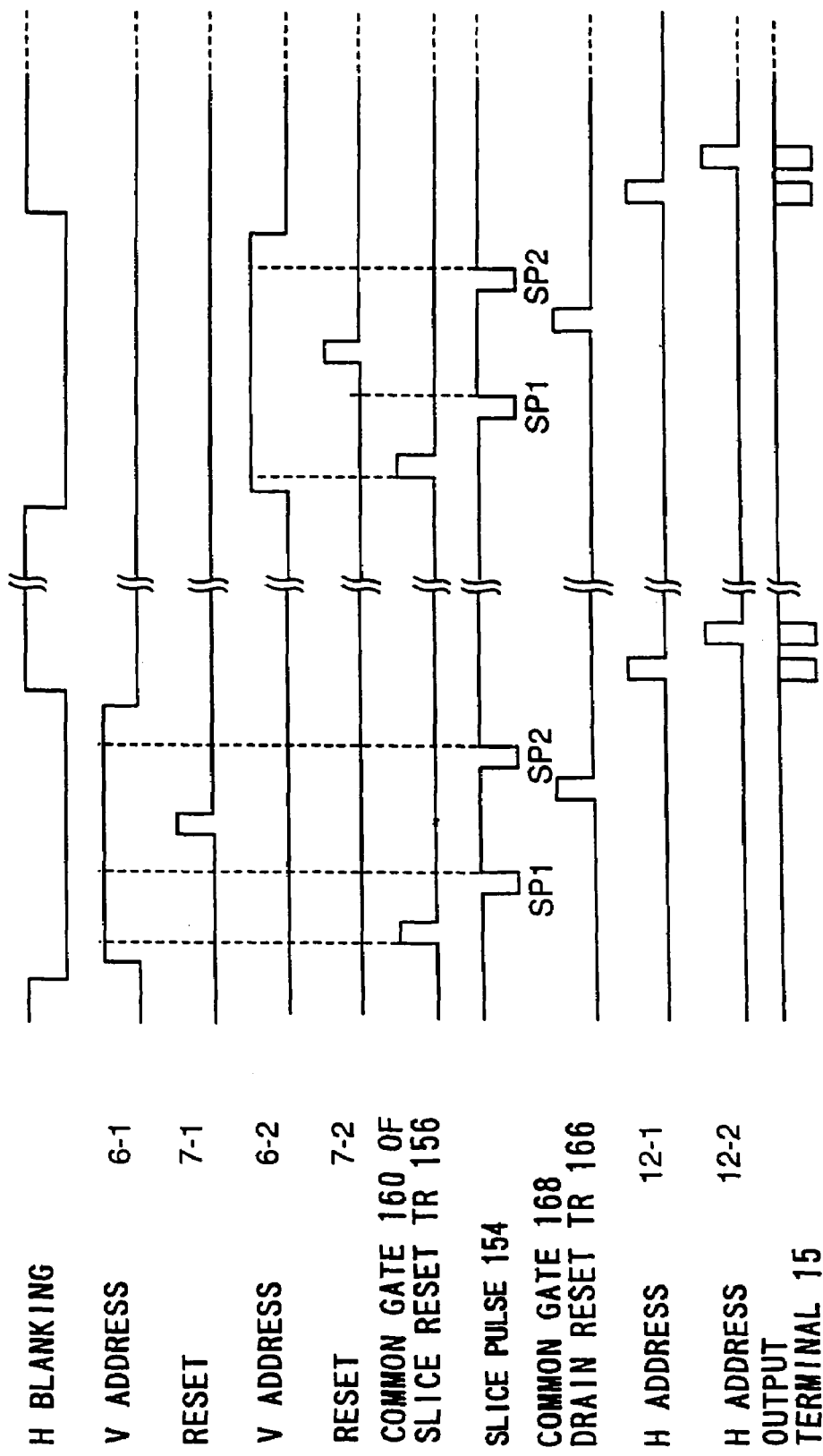
FIG. 22 is a timing chart showing the operation of the fifth embodiment.
Figure 23:
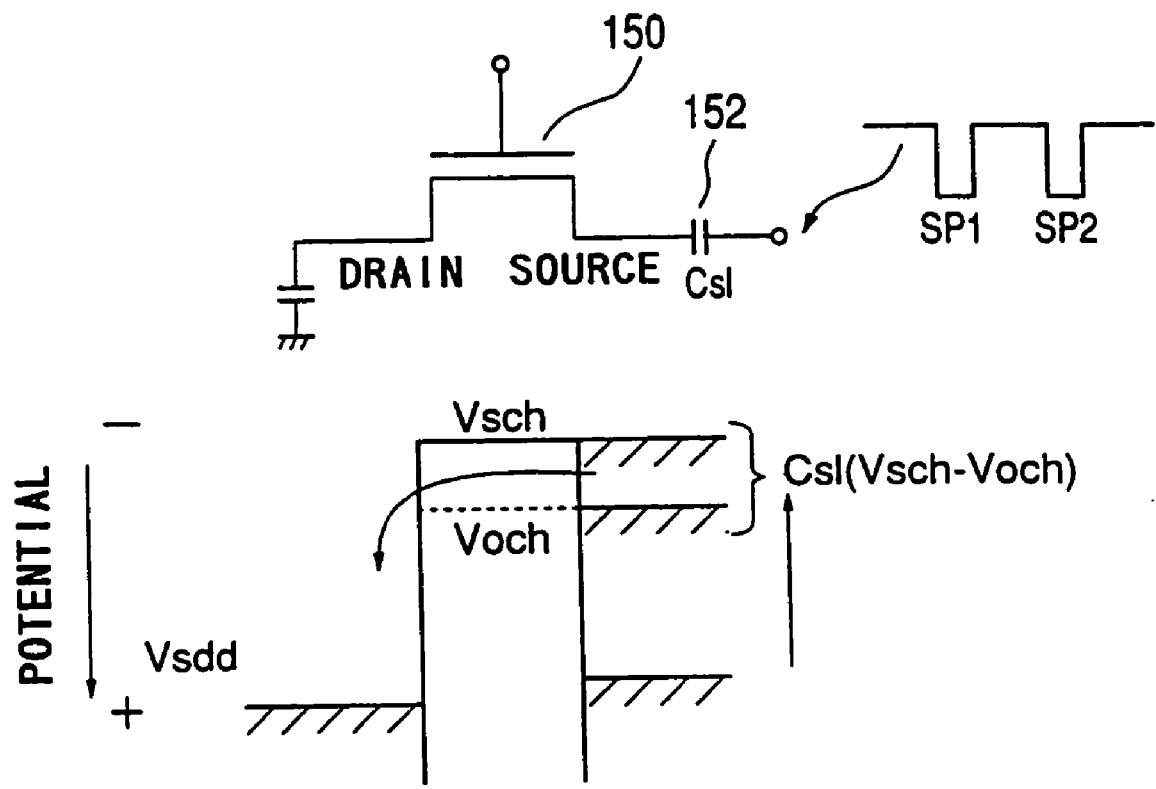
FIG. 23 is a potential chart of a slice transistor in the fifth embodiment.

A method of driving this embodiment will be described next. FIG. 22 is a timing chart showing the operation of the embodiment. FIG. 23 is a potential chart of each of the slice transistors 150-1, 150-2, . . . .

When a high-level vertical address pulse is applied to a vertical address line 6-1 in the first row, only the vertical selection transistors 66 of the unit cells in this row are turned on, and source follower circuits are formed by the amplification transistors 64 in this row and the load transistors 9-1, 9-2, . . . .

Subsequently, a slice reset pulse is applied to the slice reset terminal 160 to turn on the slice reset transistors 156-1, 156-2, . . . and initialize the charges in the slice capacitors 152-1, 152-2, . . . .

The slice reset transistors 156 are turned off. At this time, signal voltages corresponding to the signal charges in the photodiodes in the first row which has been addressed appear on the vertical signal lines 8-1, 8-2, . . . .

A first slice pulse SP1 is applied to the slice pulse supply terminal 154. With this operation, the first slice charge exceeds a channel potential $V_{sch}$ under the gate of the slice transistor 150 in the presence of a signal (signal and noise) and is transferred to the drain. In this case, since a drain reset pulse is applied to a drain reset terminal 168 to turn on the drain reset transistor 166, the drain potential is fixed to a voltage $V_{sdd}$ of the storage drain power supply terminal 164. The first slice charge is therefore discharged to the storage drain power supply terminal 164 through the drain reset transistor 166.

When a reset pulse is applied to the reset line 7-1, only noise components without signals are output to the vertical signal lines 8-1, 8-2, . . . in which the photodiodes of the cells are reset. A second slice pulse SP2 is applied to the slice pulse supply terminal 154. With this operation, the second slice charge exceeds a channel potential $V_{och}$ under the gate of the slice transistor 150 to which a voltage is being applied in the absence of a signal charge, and is transferred to the drain. In this case, since the drain reset transistor 166 is off, the second slice charge is transferred to the slice charge transfer capacitance 162.

Horizontal selection pulses are sequentially applied from the horizontal address circuit 13 to the horizontal selection transistors 12-1, 12-2, . . . to sequentially output signals corresponding to lines (rows) from the horizontal signal line 15. By sequentially performing this operation for the subsequent lines, all the signals in the two-dimensional matrix can be read out.

In this device, if the value of the slice capacitance 152 is represented by $C_{s1}$, the charge (second slice charge) to be finally output to the horizontal signal line 15 is given by $$C_{s1} \times (V_{sch} - V_{och})$$

That is, the device is characterized in that fixed pattern noise due to threshold variations of the amplification transistor 64 in each unit cell is suppressed because the charge proportional to the difference between the voltage set when a signal is present and the voltage set when no signal is present after a reset operation, appears on the signal line. The circuit arrangement for converting a voltage appearing on the vertical signal line 8 into a charge, and performing subtraction in the charge domain in this manner can also be called a noise canceler.

For example, a noise canceling method of this type differs from that in the first embodiment in FIG. 3. In the first embodiment, at the clamp node 145, no noise is present in the voltage domain. That is, noise canceling is performed in the voltage domain. In contrast to this, in this type of method, at the source of the slice transistor 150, noise is not canceled in the voltage domain. When the second slice pulse SP2 is applied, however, the charge whose noise has been canceled is transferred to the drain for the first time. That is, the noise has been canceled in the charge domain.

As described above, according to the fifth embodiment, since an output from each unit cell is output through the noise canceler, fixed pattern noise due to threshold variations of the amplification transistor of the unit cell can be removed.

In addition, since an output from each unit cell is supplied to the noise canceler through the gate capacitance of the slice transistor, the impedance of the noise canceler remains almost the same, viewing from the unit cell, in a noise output operation and a signal-and-noise output operation. For this reason, in both the output operations, the noise components are almost the same. When the difference between the noise output and the signal-and-noise output is obtained, the noise output can be accurately reduced, and only the signal component can be extracted, thereby accurately canceling the noise. Furthermore, when the noise canceler is viewed from the unit cell, only the gate capacitance can be seen in terms of impedance. Since this capacitance is very small, the noise can be reliably canceled within a short period of time.

Note that the second slice pulse SP2 may be influenced by the immediately preceding first slice pulse SP1. The influences of the first and second slice pulses on the operations of the first and second transistors can be effectively equalized by inserting a dummy slice pulse immediately before the first slice pulse SP1. If the first and second slice pulses SP1 and SP2 have the same amplitude, the signal charge in a small signal region cannot be read out or a deterioration in linearity occurs depending on voltage conditions. For this reason, for stable operations, the amplitude of the second slice pulse SP2 is preferably set to be larger than that of the first slice pulse SP1 to add a bias charge to the charge to be read out with the second slice pulse SP2. A method of setting the width of the second slice pulse SP2 to be larger than that of the first slice-pulse SP1 can also be used effectively.

Sixth Embodiment

Figure 24:
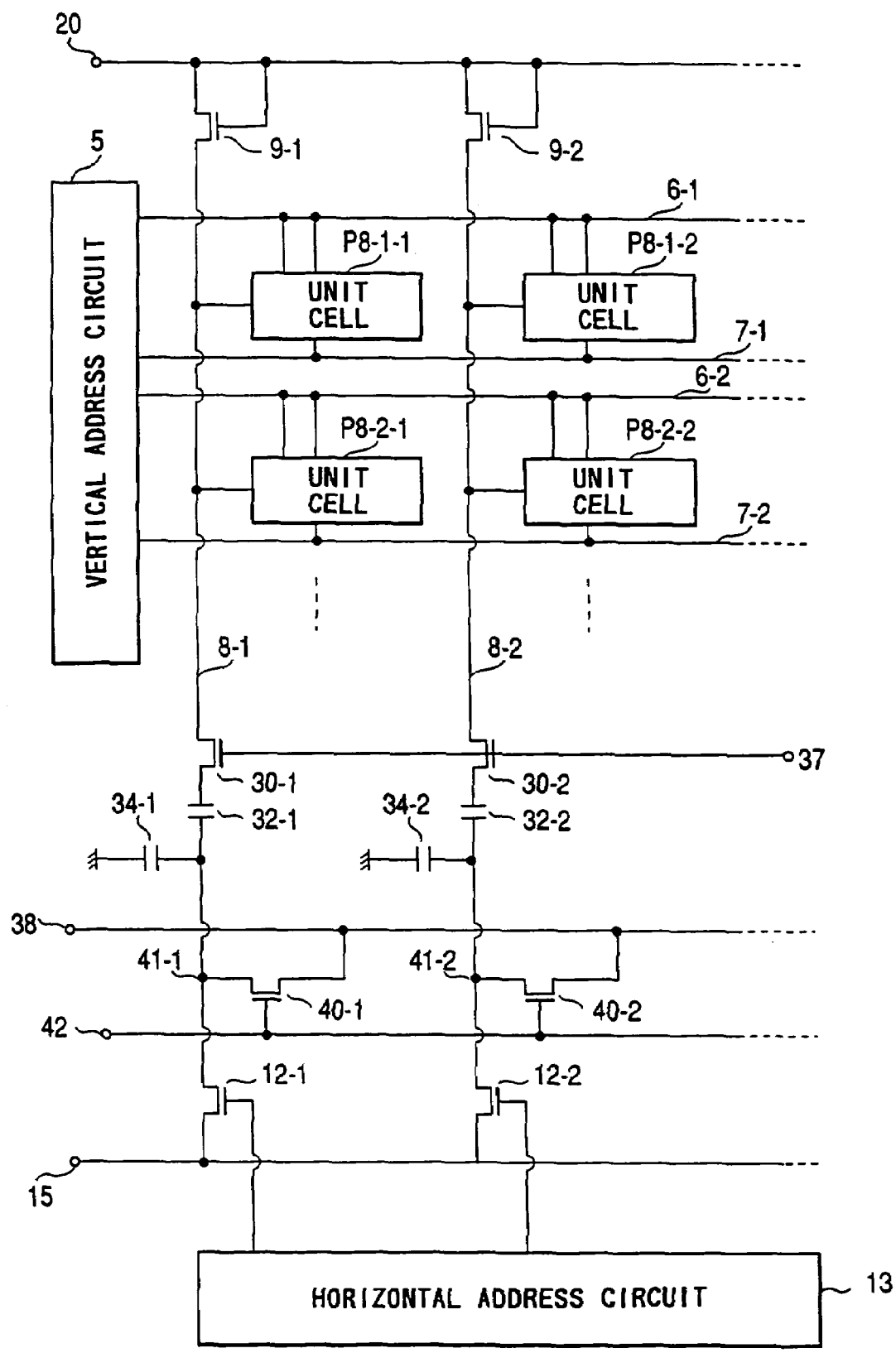
FIG. 24 is a circuit diagram showing the arrangement of an MOS-type solid-state imaging apparatus according to a sixth embodiment of the present invention.

FIG. 24 is a circuit diagram showing an imaging apparatus using an amplification-type MOS sensor according to a sixth embodiment of the present invention. The circuit arrangement of each unit cell PB-i-j is the same as that in the first embodiment.

In the sixth embodiment, the impedance conversion circuits constituted by the source follow transistors in the second embodiment are omitted.

Seventh Embodiment

Figure 25:
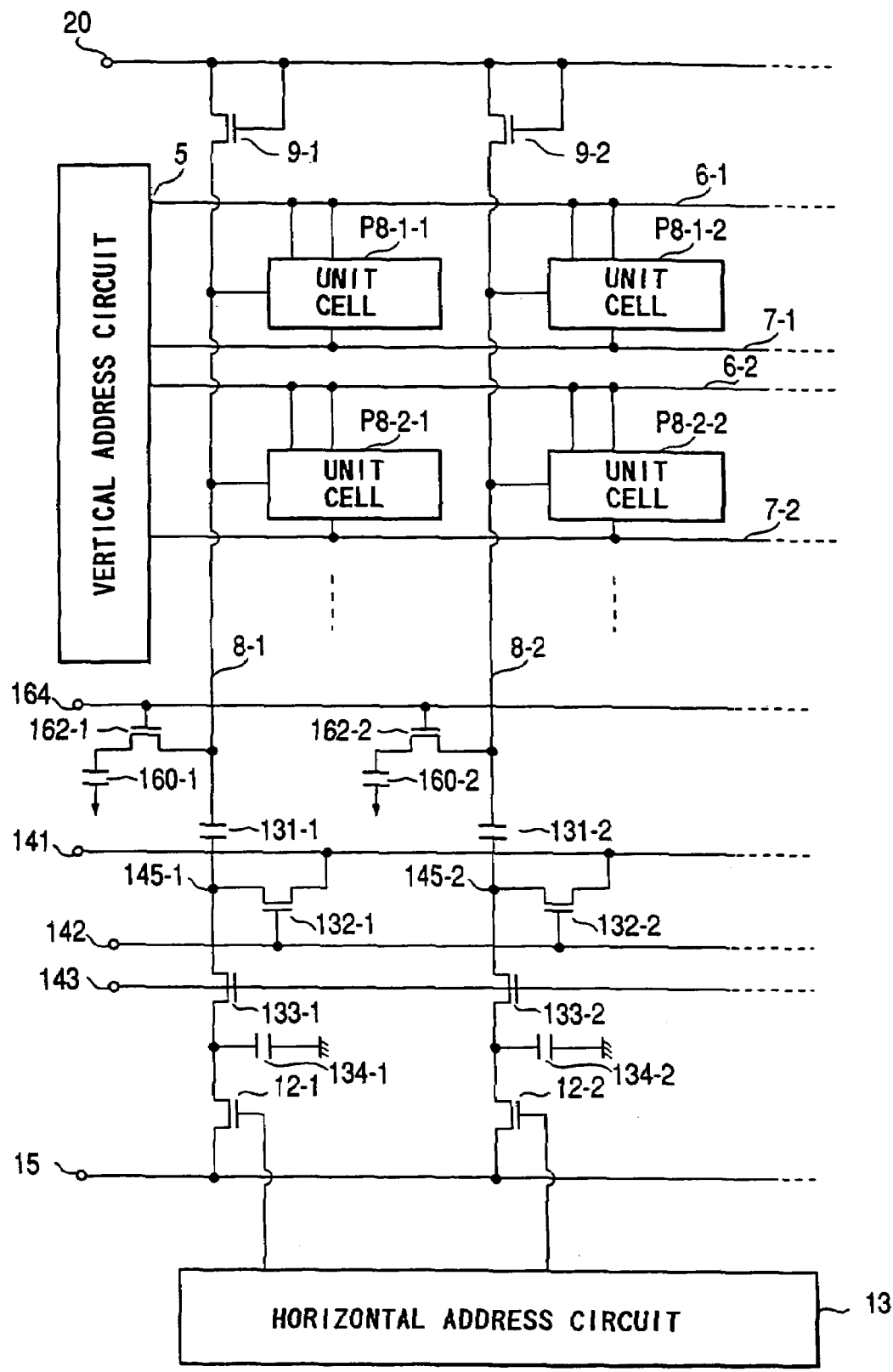
FIG. 25 is a circuit diagram showing a first arrangement of an MOS-type solid-state imaging apparatus according to a seventh embodiment of the present invention.
Figure 26:
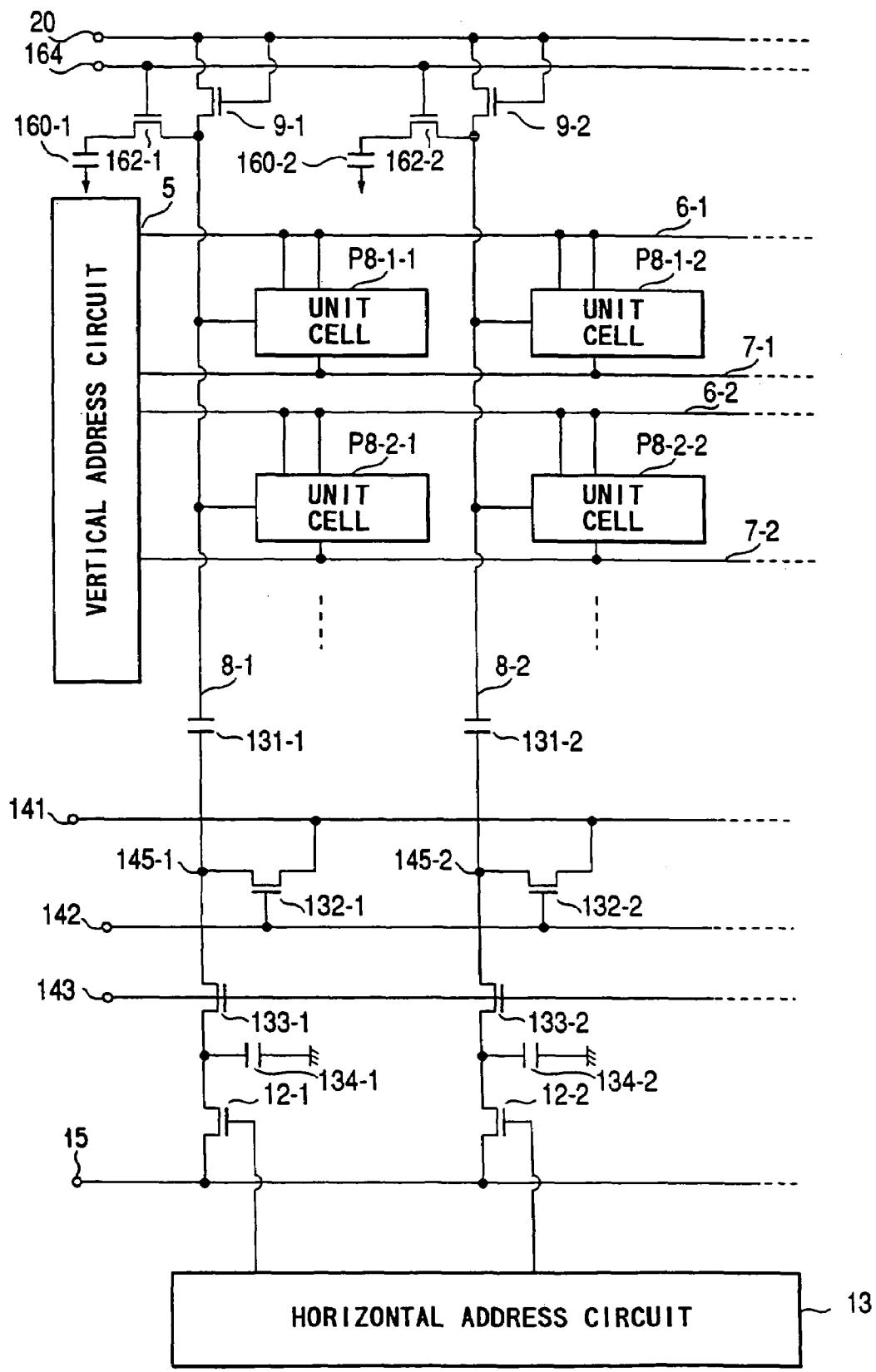
FIG. 26 is a circuit diagram showing a second arrangement of the MOS-type solid-state imaging apparatus according to the seventh embodiment of the present invention.

FIGS. 25 and 26 are circuit diagrams each showing the circuit arrangement of an imaging apparatus using an amplification-type MOS sensor according to a seventh embodiment of the present invention. The circuit arrangement of each unit cell P8-i-j is the same as that in the first embodiment.

Although this embodiment and the first embodiment shown in FIG. 3 have many common parts, they differ in that capacitors $C_{cmp}$ 160-1, 160-2, . . . for correcting the differences between the impedances of the noise cancelers, viewed from the unit cell, in a signal-and-noise output operation and a noise output operation are connected in parallel with vertical signal lines 8-1, 8-2, . . . through switches 162-1, 162-2, . . . so as to be located on the imaging region (unit cell) side with respect to clamp capacitors 131-1, 131-2, . . . . In the case shown in FIG. 25, a correction capacitor 160 and a switch 162 are connected between the clamp capacitor 131 and the imaging region. In the case shown in FIG. 26, the correction capacitor 160 and the switch. 162 are connected between the imaging region and the load transistor 9.

Figure 27:
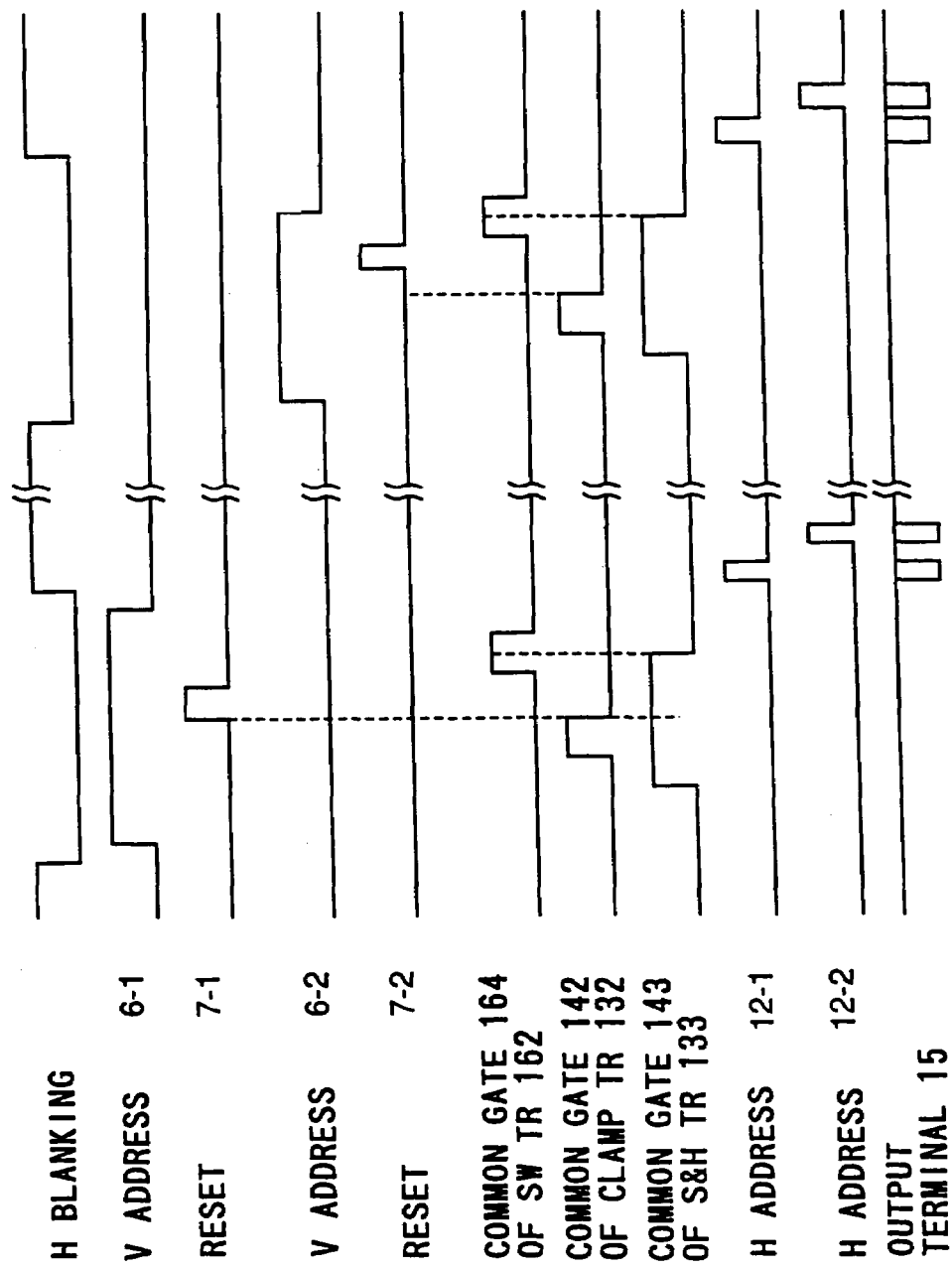
FIG. 27 is a timing chart showing the operation of the seventh embodiment.

FIG. 27 shows the operation timing of this embodiment. The switch 162 is turned on in an interval in which only noise after the reset operation of the photodiode is output to the vertical signal line after a clamp operation is completed by the clamp transistor 132. In this case, letting $C_{SH}$ be the sample/hold capacitor 134 and $C_{CL}$ be the clamp capacitor 131, the capacitance connected to the vertical signal line 8 in a sample/hold operation is given by $$C = C_{CMP} + C_{SH} \cdot C_{CL}/(C_{CL} + C_{SH})$$

If the correction capacitor $C_{CMP}$ is set with the following range:

$$2\{C_{CL} - C_{CL} \cdot C_{SH}/(C_{CL} + C_{SH})\} > C_{CMP} > 0$$

the capacitance connected to the vertical signal line becomes closer to the capacitance $C_{CL}$ of the clamp capacitor 131 than the capacitance without any correction capacitor. For this reason, the difference $V_{CL}$ decreases, and the noise also decreases.

FIG. 28 shows changes in the potential of the vertical signal line 8 and the potential of the clamp node 145 with time. In this embodiment, when the potential of the vertical signal line 8 returns to the same potential in a clamp operation and a sample/hold operation, as in a dark period during which a signal is zero, the potential of the clamp node at the end of a sample/hold operation becomes 0 without returning to a value near $\Delta V_{CL}$. This can therefore prevent troubles, e.g., appearance of a signal corresponding to $\Delta V_{CL}$ in a dark period during which a signal is zero. Consequently, noise due to variations in $\Delta V_{CL}$ can be prevented.

As described above, according to this embodiment, in the MOS-type solid-state imaging apparatus with the noise reduction circuits, the correction capacitors 160 are connected to the vertical signal lines 8 to suppress capacitance changes in a noise reducing operation which are the cause of noise, thus further contributing to noise reduction. That is, since the impedance viewed from each cell remains the same in a signal-and-noise output operation after selection of a photodiode and a noise output operation after a reset operation, noise canceling can be accurately performed.

Modifications of the seventh embodiment may be made such that correction capacitors are connected to the noise cancelers in the second embodiment in FIG. 16, the third embodiment in FIG. 19, the fourth embodiment in FIG. 20, the fifth embodiment in FIG. 21, and the sixth embodiment in FIG. 24.

The second to seventh embodiments described above differ from the first embodiment in the noise canceler circuit portions. Other embodiments which differ from the first to seventh embodiments in the structure of each unit cell will be described next.

Eighth Embodiment

Figure 29:
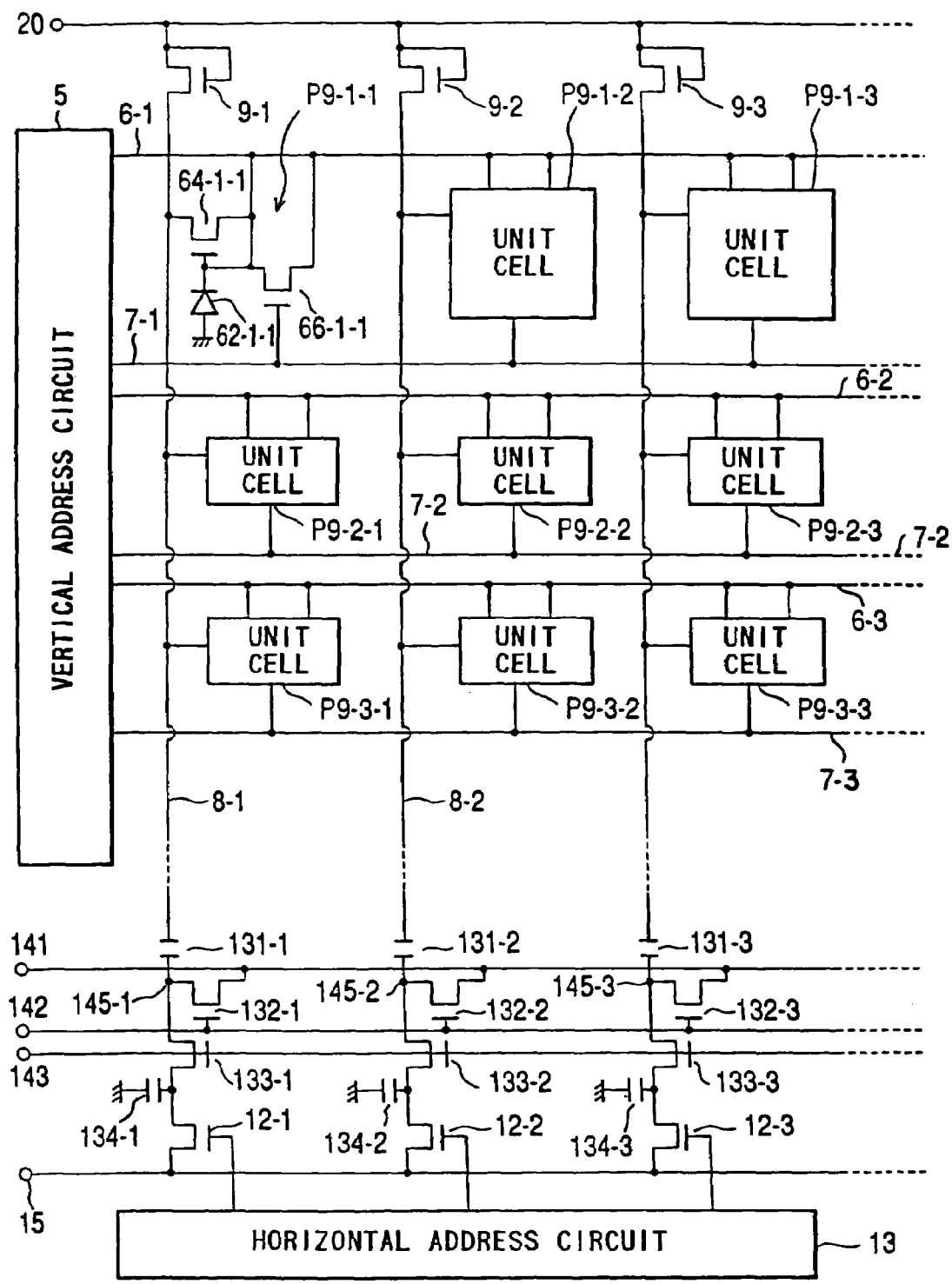
FIG. 29 is a circuit diagram showing the arrangement of the unit cells of an MOS-type solid-state imaging apparatus according to an eighth embodiment of the present invention.

FIG. 29 is a circuit diagram showing the overall arrangement of a solid-state imaging apparatus using an amplification-type MOS sensor according to the eighth embodiment of the present invention. Each unit cell P9-i-j in this embodiment is equivalent to each unit cell in the first embodiment from which the address capacitor 69 is omitted.

In this embodiment, when the drain of the amplification transistor 64 is addressed by the vertical address circuit 5, a short channel effect is used to change the potential of the channel under the gate of the amplification transistor 64. That is, this embodiment uses a phenomenon in which when the potential of the drain of the amplification transistor 64 rises, a depletion layer extends from the drain to the channel under the gate, and the threshold voltage changes to the negative side. The principle of the phenomenon in which only an output signal from the photodiode 62 of each unit cell on an addressed line appears on the vertical signal line 8 is the same as that in the first embodiment.

As described above, according to this embodiment, the vertical address line can be addressed without an address capacitor as well as a vertical selection transistor. With this structure, the number of elements can be decreased, and a reduction in cell size can be attained as compared with the first embodiment.

In the eighth embodiment, as in the first embodiment, the noise canceler portion can be modified. That is, the description made with reference to FIGS. 3 to 28 also applies to the eighth embodiment.

Ninth Embodiment

Figure 1:
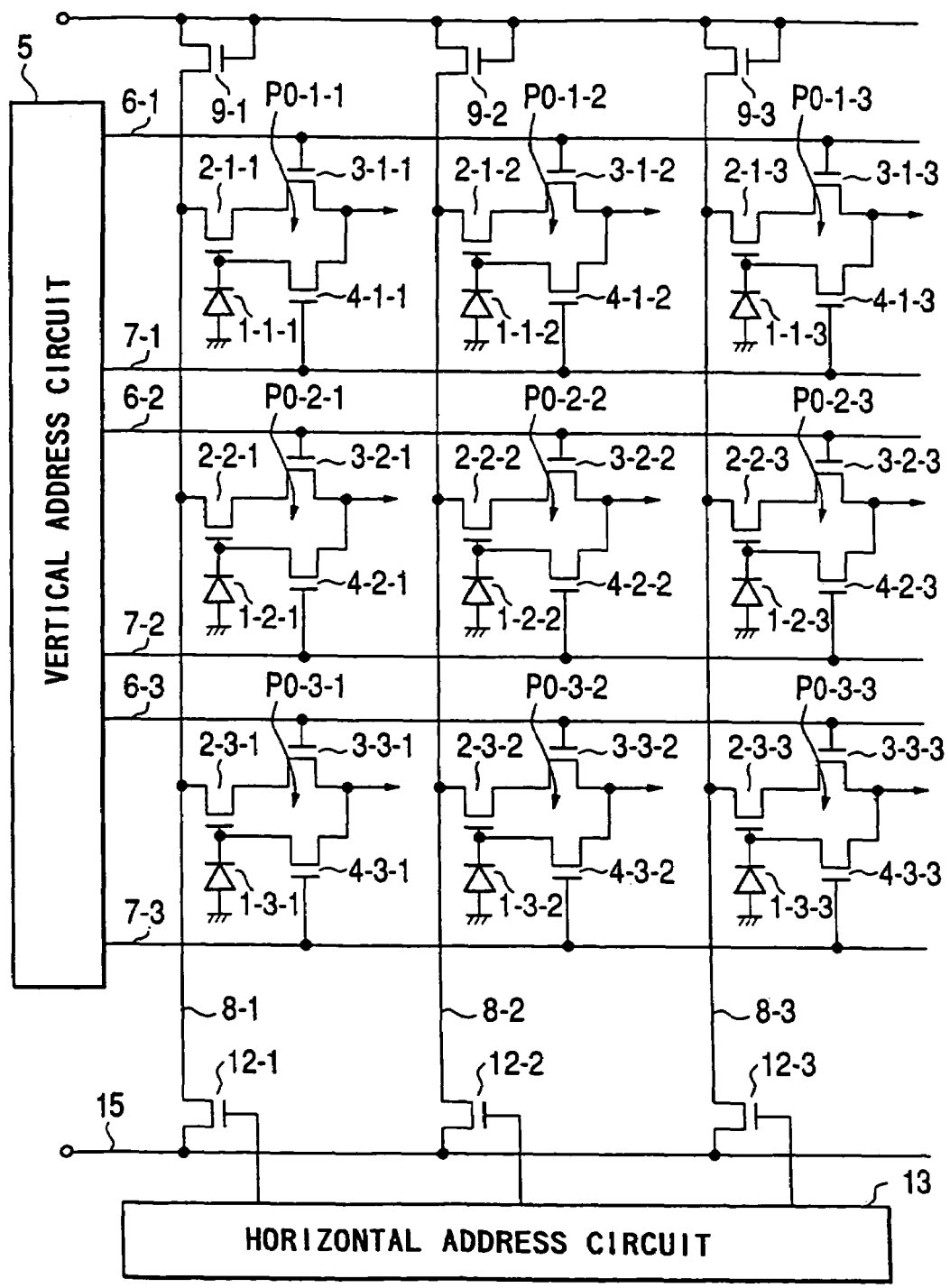
FIG. 1 is a circuit diagram showing the arrangement of a conventional MOS-type solid-state imaging apparatus.
Figure 2:
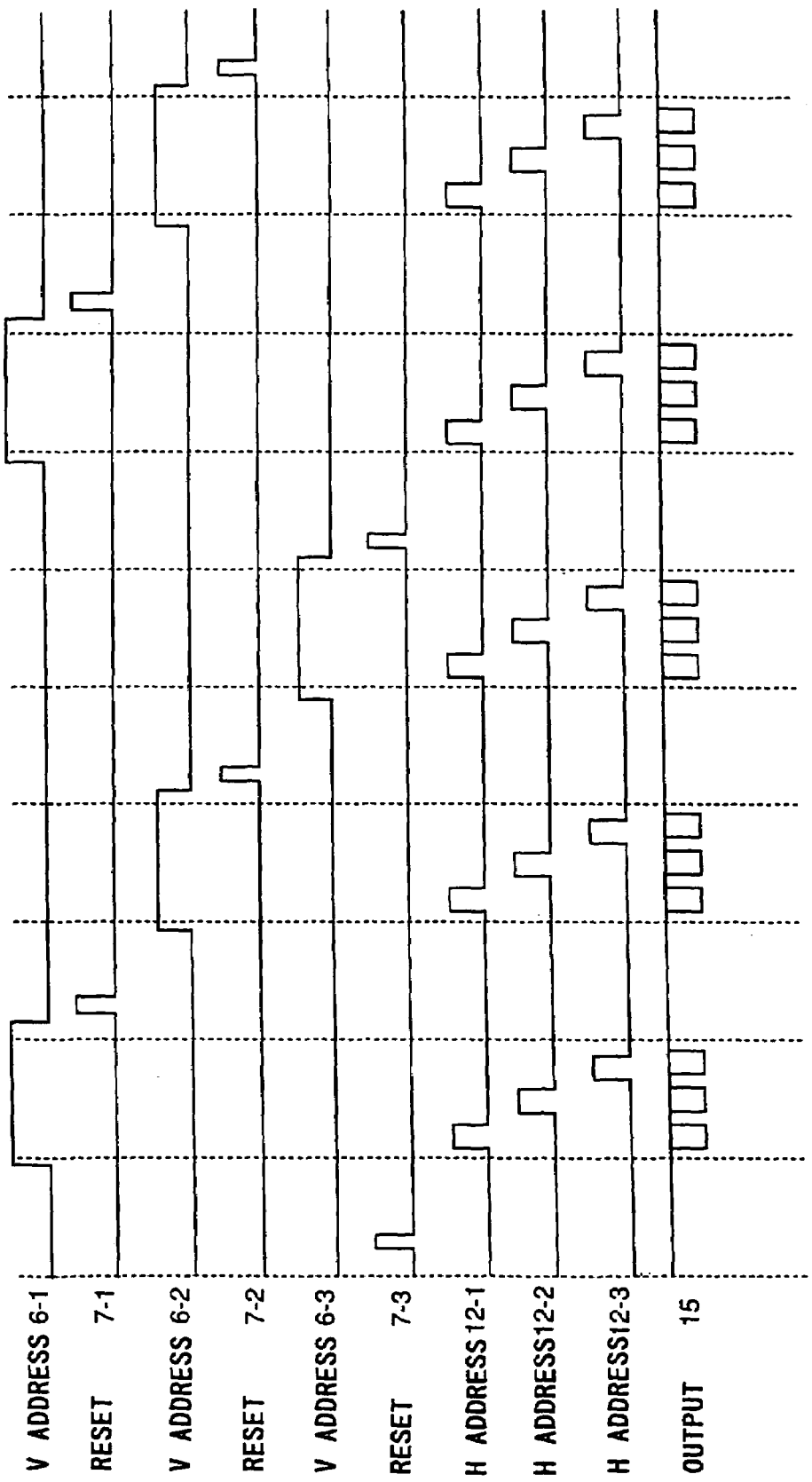
FIG. 2 is a timing chart showing the operation of the conventional apparatus shown in FIG. 1.
Figure 30:
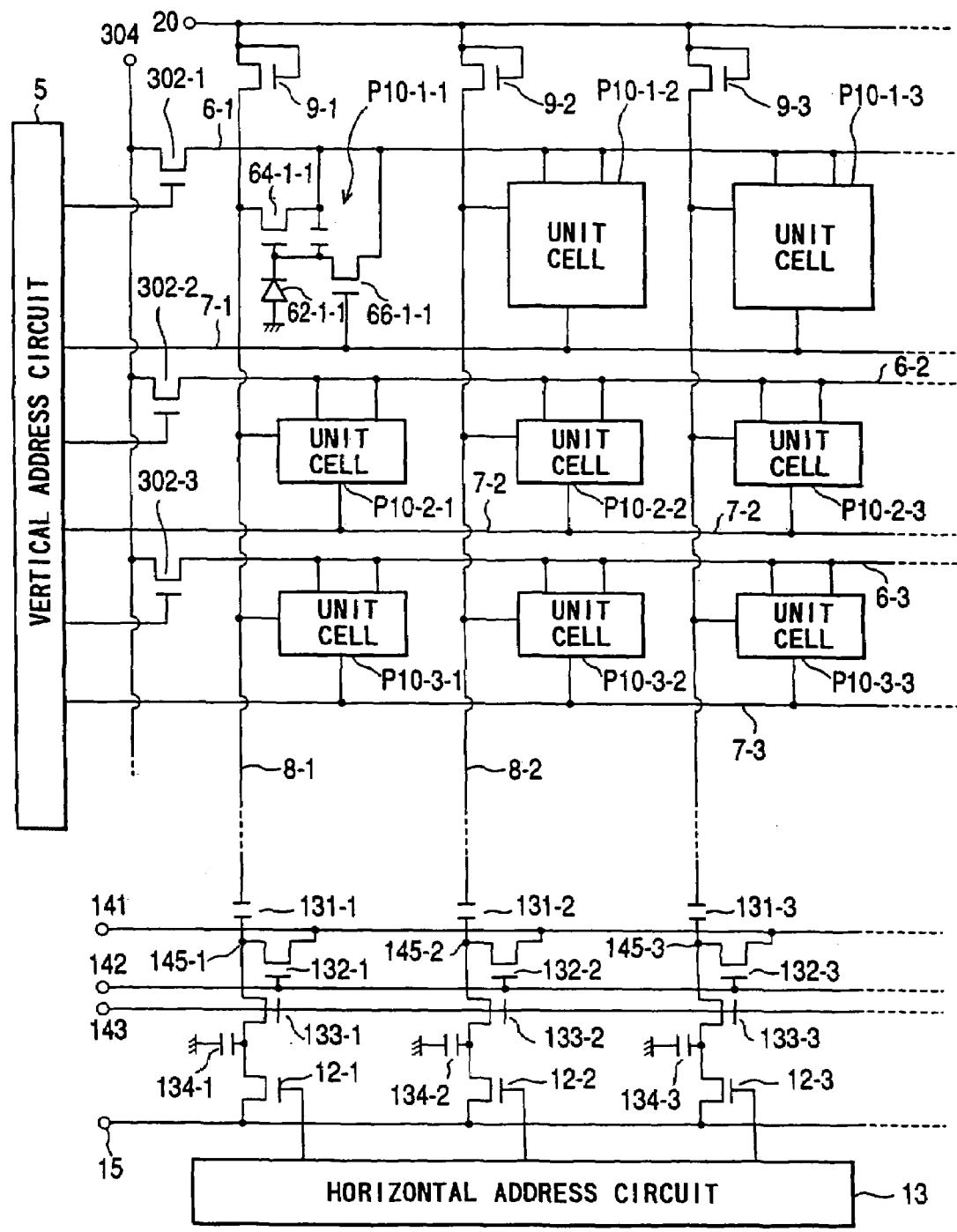
FIG. 30 is a circuit diagram showing the arrangement of the unit cells of an MOS-type solid-state imaging apparatus according to a ninth embodiment of the present invention.

FIG. 30 is a circuit diagram showing the overall arrangement of a solid-state imaging apparatus using an amplification-type MOS sensor according to the ninth embodiment. Each cell P10-i-j in this embodiment is designed such that the vertical selection transistor 3-i-j of each unit cell in the prior art shown in FIG. 1 is set outside the cell, and only one vertical selection transistor is arranged for each vertical address line. That is, each unit cell P10-i-j is constituted by a photodiode 62-i-j, an amplification transistor 64-i-j for amplifying a detection signal from the photodiode 62-i-j, and a reset transistor 66-i-j for resetting the signal charge in the photodiode 62-i-j.

The vertical address lines 6-1, 6-2, . . . horizontally extended from the vertical address circuit 5 are connected to the gates of vertical selection transistors 302-1, 302-2, . . . . The sources of the vertical selection transistors 302-1, 302-2, . . . are connected to the sources of the amplification transistors 64 and the reset transistors 66 of the respective unit cells. The drains of the vertical selection transistors 302-1, 302-2, . . . are commonly connected to a drain terminal 304.

According to this embodiment, since one vertical address line addressed by the vertical address circuit 5 is set at the level (high level) of the common drain power supply 304 because the vertical selection transistors 302 are turned on. The vertical address lines which are not addressed are electrically floating. For this reason, the amplification transistors 64 of the unit cells connected to the vertical address lines which are not addressed do not operate, and only the signals detected by the photodiodes 62 of the unit cells connected to the addressed vertical address line appear on the vertical signal lines 8. The operation timing is the same as that in the first embodiment shown in FIG. 7.

In the ninth embodiment, as in the first embodiment, the noise cancelers can be modified. That is, the description made with reference to FIGS. 3 to 28 applies to the ninth embodiment.

Tenth Embodiment

Figure 31:
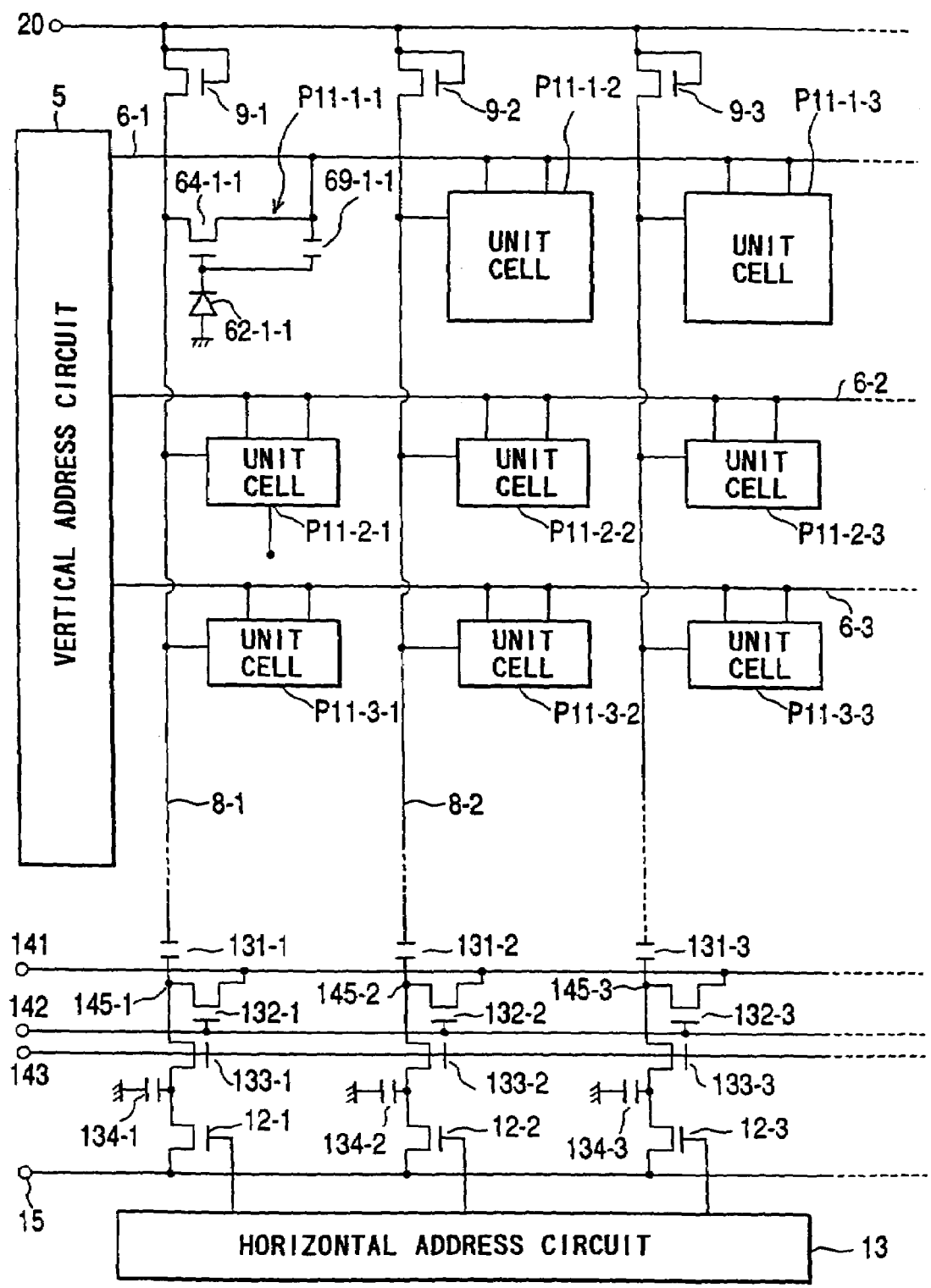
FIG. 31 is a circuit diagram showing the arrangement of the unit cells of an MOS-type solid-state imaging apparatus according to a tenth embodiment of the present invention.

FIG. 31 is a circuit diagram showing the overall arrangement of a solid-state imaging apparatus using an amplification-type MOS sensor according to the tenth embodiment. Each unit cell P11-i-j in this embodiment is equivalent to each unit cell in the first embodiment shown in FIG. 3 from which the reset transistor 66 and the reset line 7 are omitted. That is, each unit cell P11-i-j is constituted by a photodiode 62-i-j and an amplification transistor 64-i-j for amplifying a detection signal from the photodiode 62-i-j.

The vertical address lines 6-1, 6-2, . . . horizontally extending from the vertical address circuit 5 are connected to the drains of the amplification transistors 64, and are also connected to the gates of the amplification transistors 64 through address capacitors 69.

Figure 32:
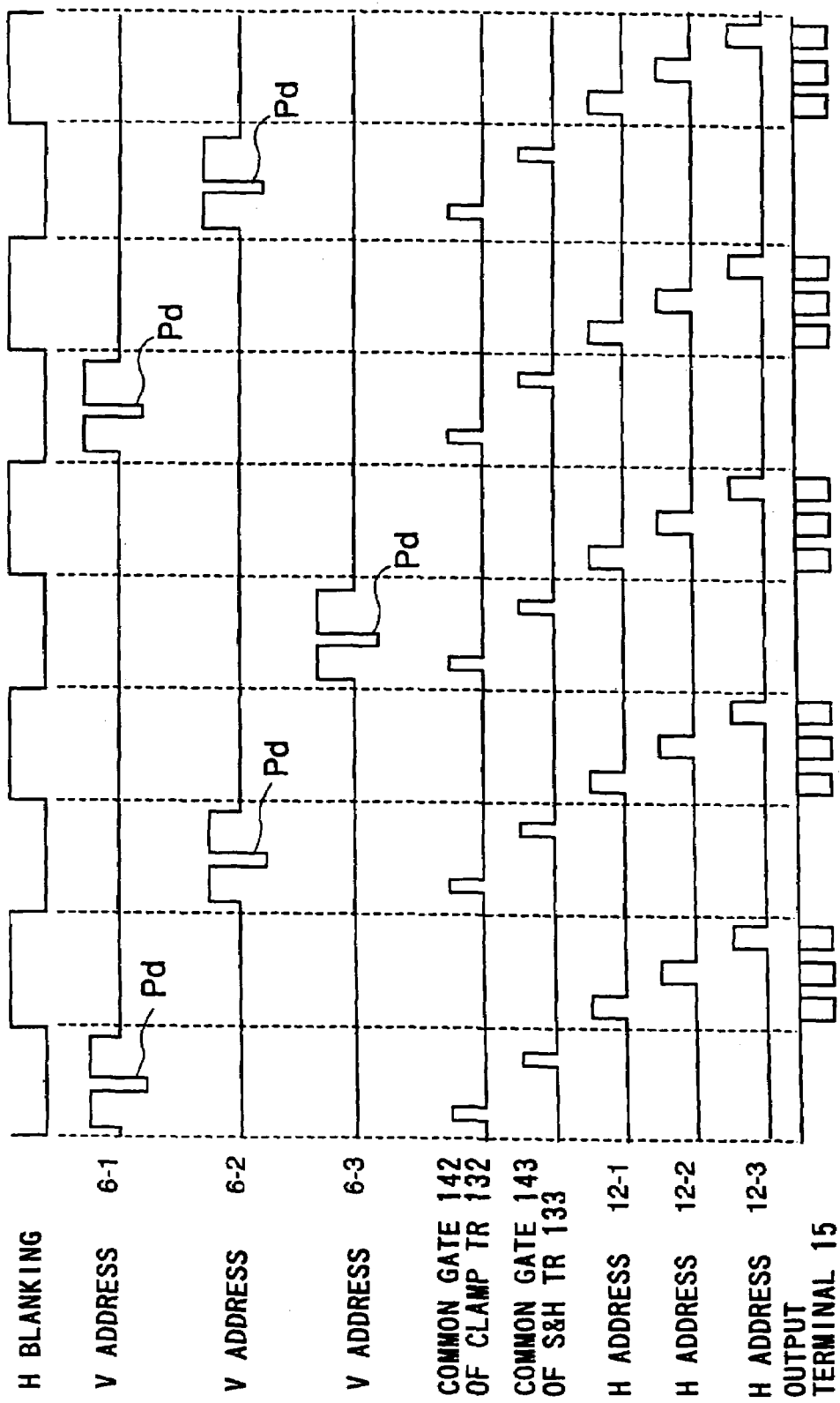
FIG. 32 is a timing chart showing the operation of the tenth embodiment.

FIG. 32 is a timing chart showing the operation of this embodiment. This timing chart is identical to that in the first embodiment shown in FIG. 7 except that signal charge-discharge negative pulses Pd are inserted in address pulses to be applied to the vertical address lines 6-1, 6-2, . . . .

A sequence in the timing chart of FIG. 32 will be described below. The following is the required sequence:

First rise of vertical address pulse→Fall of clamp pulse→Rise of signal charge discharge pulse→Fall of signal charge discharge pulse→Fall of sample/hold pulse→Second fall of vertical address pulse.

Although the order of the first rise of the vertical address pulse, the rise of the sample/hold pulse, and the rise of the clamp pulse can be arbitrarily set, the above order is preferable.

Figure 33:
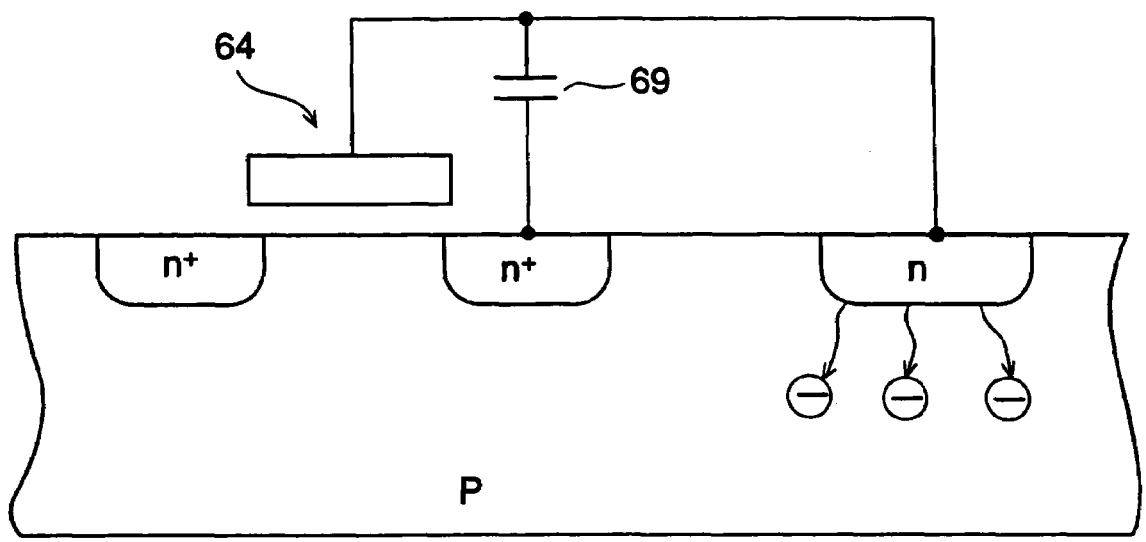
FIG. 33 is a view showing a device structure in the tenth embodiment.

FIG. 33 shows the cross-sectional structure of a unit cell and how a signal charge is discharged. The basic operation is the same as that in the first embodiment. With the address capacitors 69, the vertical address lines can be addressed without using any vertical selection transistors. After the signal read operation is complete, the signal charge-discharge negative pulses Pd are applied to the vertical address lines 6-1, 6-2, . . . to bias the potentials of the photodiodes 62 to the negative side through the coupling capacitors, thereby discharging the signal charges in the photodiodes to the p-type substrate. With this operation, the signal charges can be reset. The operation of each noise reduction circuit is the same as that in the first embodiment.

As described above, according to this embodiment, each unit cell can be constituted by the photodiode 62, the amplification transistor 64, and the address capacitor 69. A great reduction in unit cell size can therefore be attained.

In the tenth embodiment, as in the first embodiment, each noise canceler portion, can be modified. That is, the description made with reference to FIGS. 3 to 28 applies to the tenth embodiment.

Eleventh Embodiment

Figure 34:
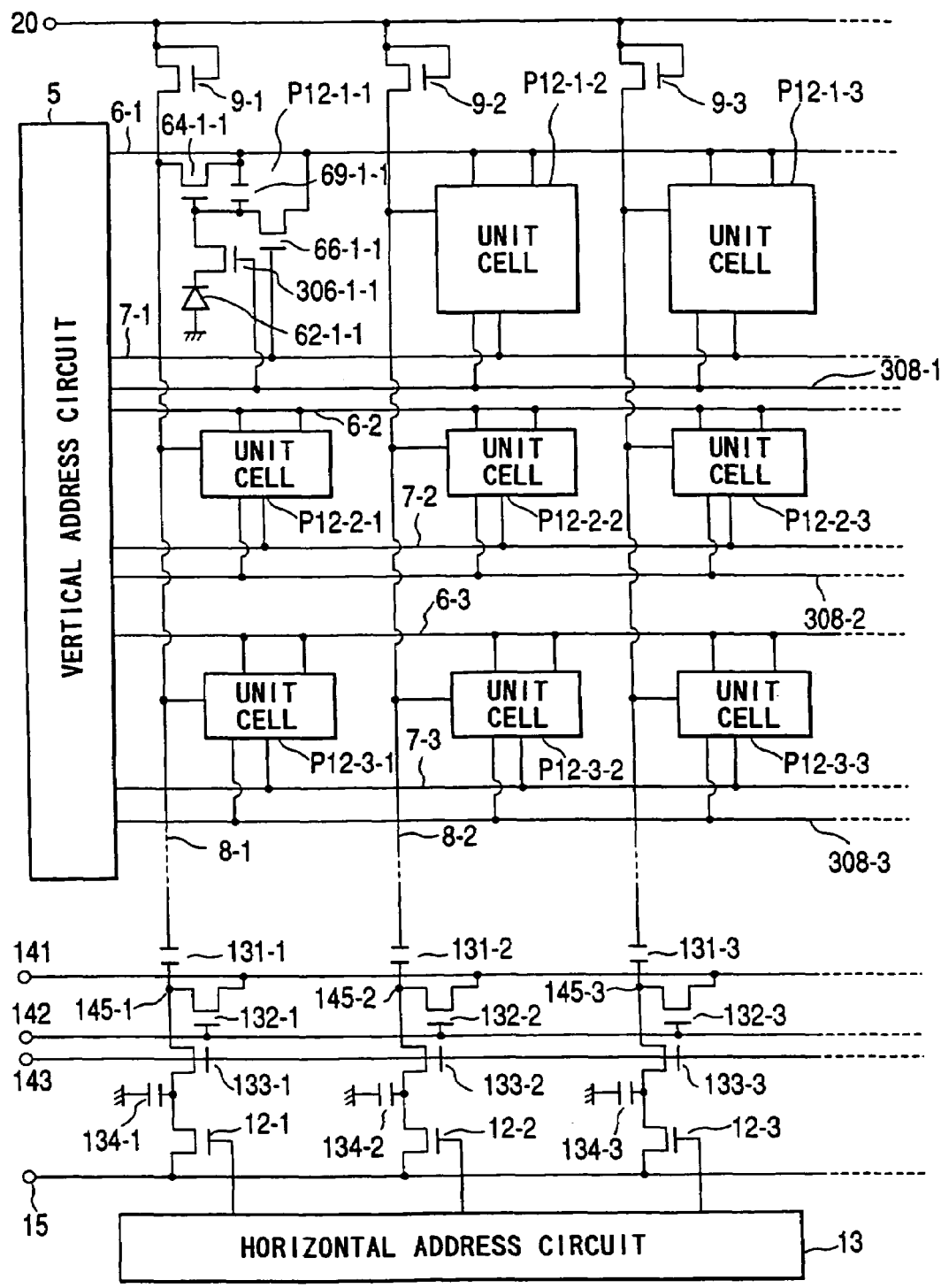
FIG. 34 is a circuit diagram showing the arrangement of the unit cells of an MOS-type solid-state imaging apparatus according to an eleventh embodiment of the present invention.

FIG. 34 is a circuit diagram showing the overall arrangement of a solid-state imaging apparatus using an amplification-type MOS sensor according to the eleventh embodiment. Each unit cell P12-i-j in this embodiment has the same cell structure as that in the first embodiment in FIG. 3 except that a transfer transistor 306 is connected between the photodiode 62 and the amplification transistor 64. Common gates 308 of the transfer transistors 306 are connected to the vertical address circuit 5.

Twelfth Embodiment

Figure 35:
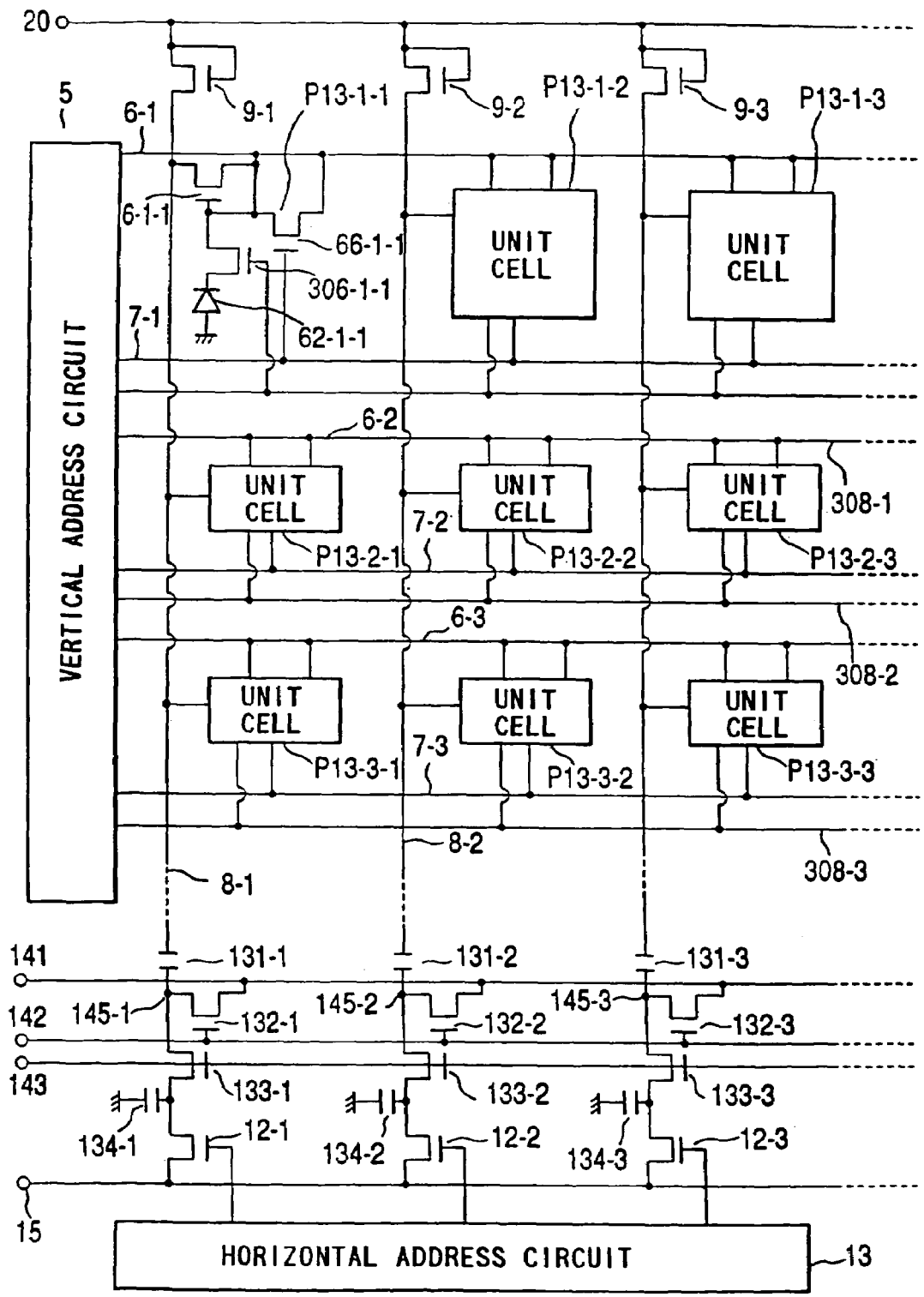
FIG. 35 is a circuit diagram showing the arrangement of the unit cells of an MOS-type solid-state imaging apparatus according to a twelfth embodiment of the present invention.

FIG. 35 is a circuit diagram showing the overall arrangement of a solid-state imaging apparatus using an amplification-type MOS sensor according to the twelfth embodiment. Each unit cell P13-i-j in this embodiment has the same cell structure as that in the eighth embodiment in FIG. 29 except that a transfer transistor 306 is connected between the photodiode 62 and the amplification transistor 64.

Thirteenth Embodiment

Figure 36:
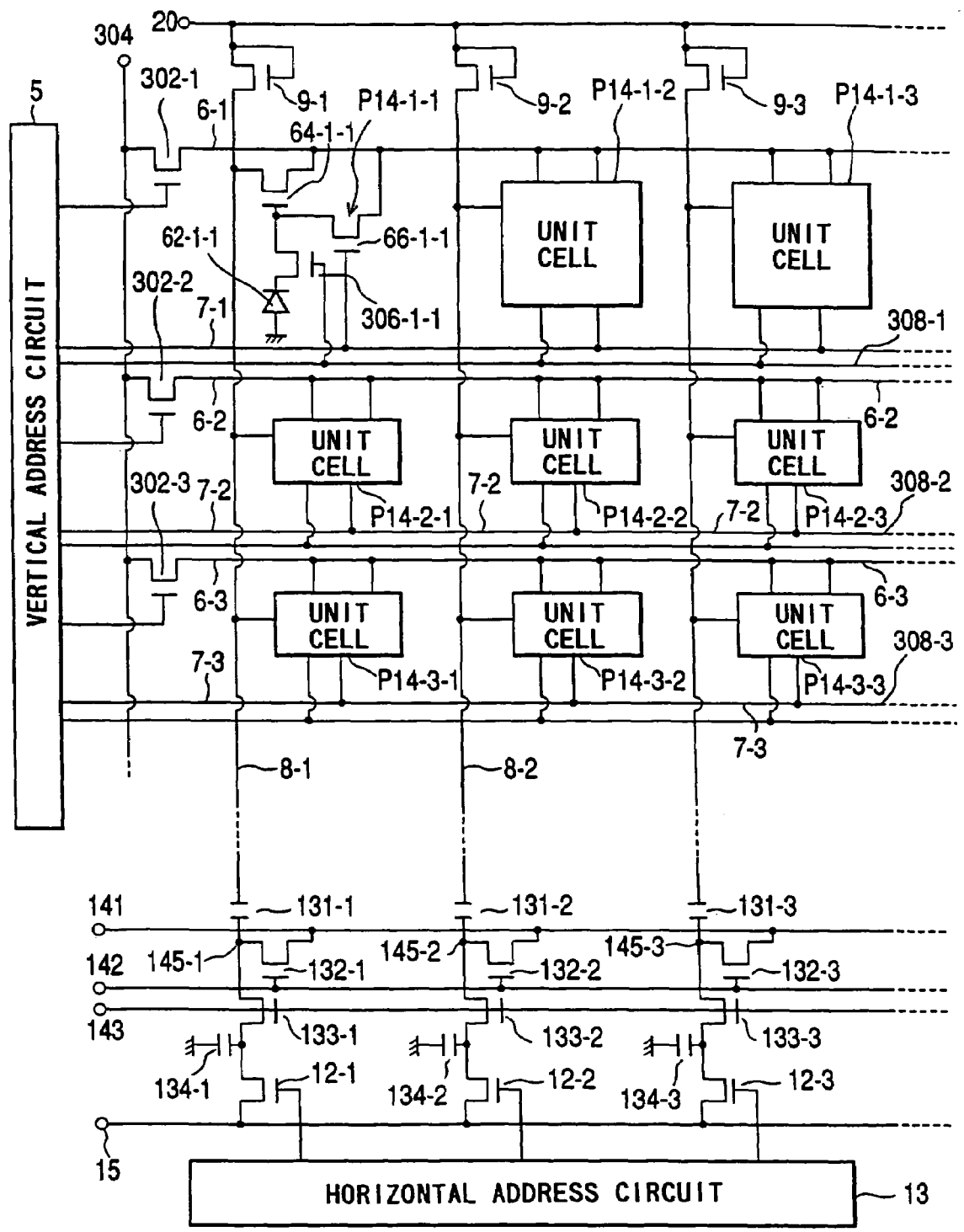
FIG. 36 is a circuit diagram showing the arrangement of the unit cells of an MOS-type solid-state imaging apparatus according to a thirteenth embodiment of the present invention.

FIG. 36 is a circuit diagram showing the overall arrangement of a solid-state imaging apparatus using an amplification-type MOS sensor according to the thirteenth embodiment. Each unit cell P14-i-j in this embodiment has the same cell structure as that in the ninth embodiment in FIG. 30 except that a transfer transistor 306 is connected between the photodiode 62 and the amplification transistor 64.

Fourteenth Embodiment

Figure 37:
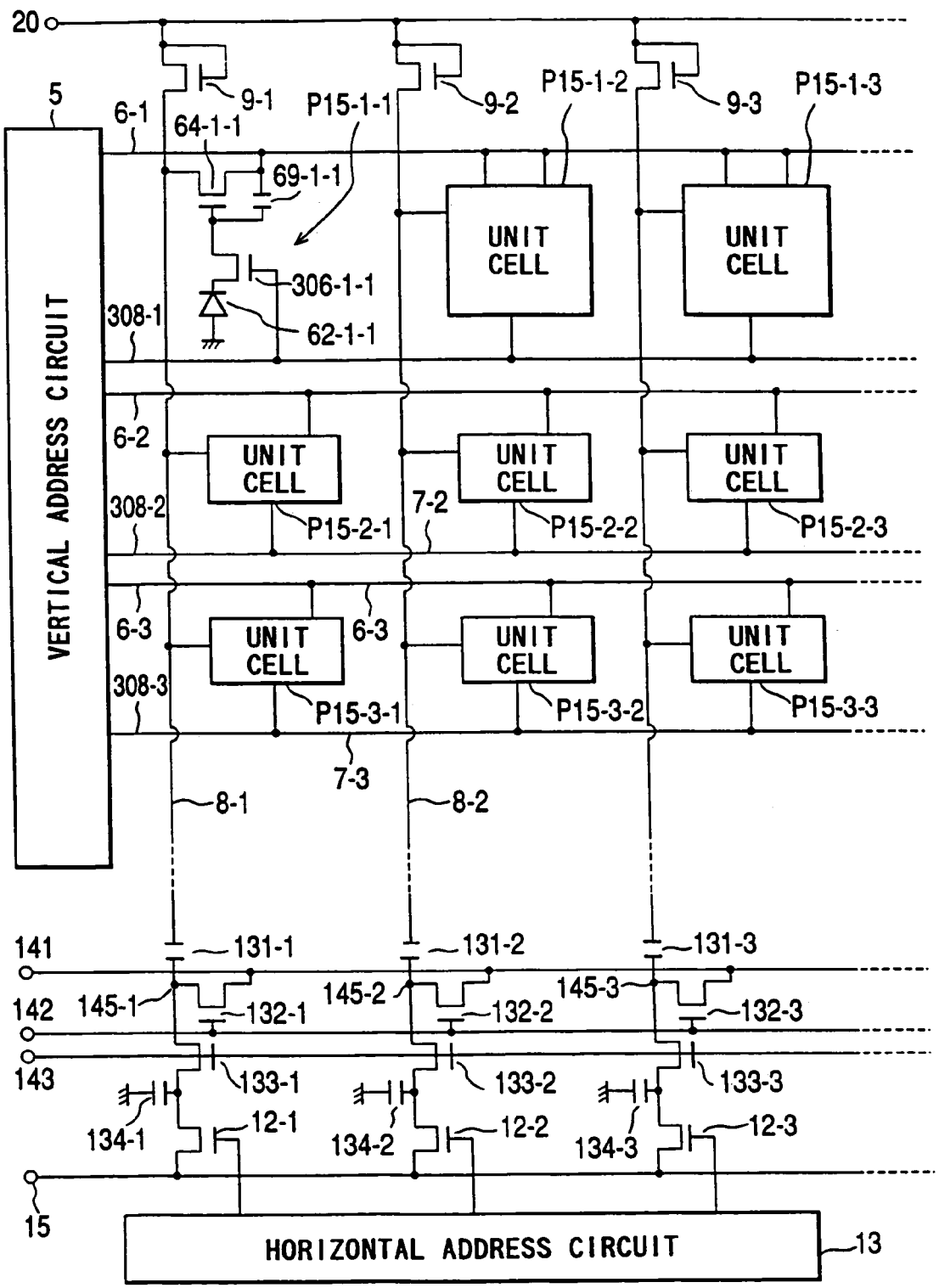
FIG. 37 is a circuit diagram showing the arrangement of the unit cells of an MOS-type solid-state imaging apparatus according to a fourteenth embodiment of the present invention.

FIG. 37 is a circuit diagram showing the overall arrangement of a solid-state imaging apparatus using an amplification-type MOS sensor according to the fourteenth embodiment. Each unit cell P15-i-j in this embodiment has the same cell structure as that in the tenth embodiment in FIG. 31 except that a transfer transistor 306 is connected between the photodiode 62 and the amplification transistor 64.

Figure 38:
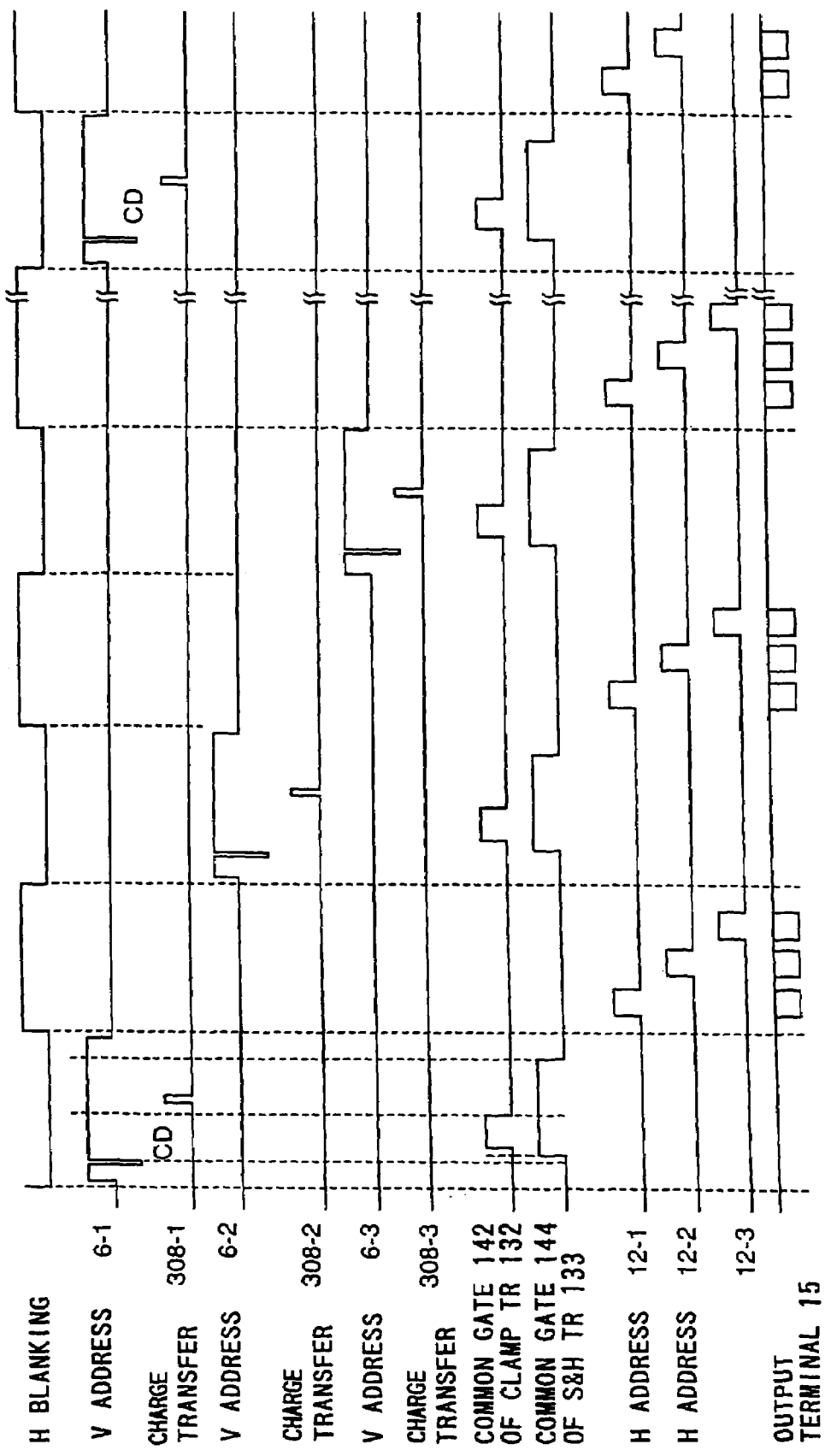
FIG. 38 is a timing chart showing the operation of the fourteenth embodiment.

FIG. 38 is a timing chart showing the operation of this embodiment. When a high-level address pulse is applied to the vertical address line 6-1 in a horizontal blanking interval, the high-level address pulse is supplied to the gate of the amplification transistor 64 of each unit cell connected to this line through the address capacitor 69. As a result, the potential of the channel under this gate becomes higher than the channel potential under the gate of the amplification transistor 64 of each unit cell connected to each of the remaining lines, and the amplification transistor 64 of each unit cell connected to this line is turned on. A source follower circuit is therefore formed by the amplification transistor 64 of each cell connected to the vertical address line 6-1 and the load transistor 9. The gate voltage of the amplification transistor 64, i.e., almost the same voltage as that of the photodiode 64, appears on the vertical signal line 8. As described above, only the gate potentials of the amplification transistors 64 on the addressed line appear on the vertical signal lines 8-1, 8-2, . . . , but the gate potentials of the amplification transistors 64 on the remaining lines do not appear. The vertical address lines can therefore be addressed without any vertical selection transistors.

Subsequently, a charge-discharge negative pulse CD having a large amplitude is applied to the vertical address line 6-1 to reset the charge in each photodiode 62. After a high-level sample/hold pulse is applied to a common gate 143 of the sample/hold transistors 133-1, 133-2, . . . , a clamp pulse is applied to a common gate 142 of the clamp transistors 132-1, 132-2, . . . to turn on the clamp transistors 132-1, 132-2, . . . and fix nodes 145-1, 145-2, . . . to the same voltage as that of a clamp power supply 141.

After the clamp transistors 132-1, 132-2, . . . are turned off, a high-level transfer pulse is applied to a charge transfer line 308-1 to turn on charge transfer transistors 306-1, 306-2, . . . . As a result, voltages obtained by adding the differences between the voltages of the vertical signal lines 8-1, 8-2, . . . with the signal charges being kept in the photodiodes 62 and those of the vertical signal lines 8-1, 8-2, . . . without the signal charges after the reset operation to the voltage of the clamp power supply 141 respectively appear on the nodes 145-1, 145-2, . . . . Thereafter, the application of sample/hold pulses is stopped.

Subsequently, horizontal address pulses are sequentially applied from the horizontal address circuit 13 to the horizontal selection transistors 12-1, 12-2, . . . to sequentially output signals corresponding to one line from the horizontal signal line 15.

A sequence in the timing chart of FIG. 38 will be described below. The following is the required sequence:

First rise of vertical address pulse→First fall of vertical address pulse→Second rise of vertical address pulse→Fall of clamp pulse→Rise of charge transfer pulse→Fall of charge transfer pulse→Fall of sample/hold pulse→Second fall of vertical address pulse.

Although the order of the second rise of the vertical address pulse, the rise of the sample/hold pulse, the rise of the clamp pulse, and the fall of the clamp pulse can be arbitrarily set, the above order is preferable.

According to the arrangements of the eleventh to fourteenth embodiments described above, each capacitance value for detecting a charge can be decreased, and the sensitivity can be improved by separating the photodiode 62 from the amplification transistor 64. In addition, after the transfer transistor 306 is turned off to output a voltage corresponding to a noise component in the absence a signal charge to the vertical signal line 8, the transfer transistor 306 may be turned on to output a voltage corresponding to a signal component plus noise component in the presence of a signal charge. If a reset operation is performed first in this manner, random noise due to the reset operation can also be removed.

As in the first embodiment, the noise cancelers in the eleventh to fourteenth embodiments can be modified. That is, the description made with reference to FIGS. 3 to 28 applies to the eleventh to fourteenth embodiments.

The present invention is not limited to the embodiments described above. Various modifications of the embodiments can be made. If, for example, the amplification transistors of unit cells can be made without any threshold variations, since no fixed pattern noise is caused, the noise cancelers can be omitted. If fixed pattern noise exerts no influence on the image quality, the noise cancelers can also be omitted.

Although the gate and source of each load transistor are connected to the same power supply line, they may be connected to different power supplies. With this arrangement, a current flowing in each transistor can be controlled, and the power consumption can be reduced.

Figure 39:
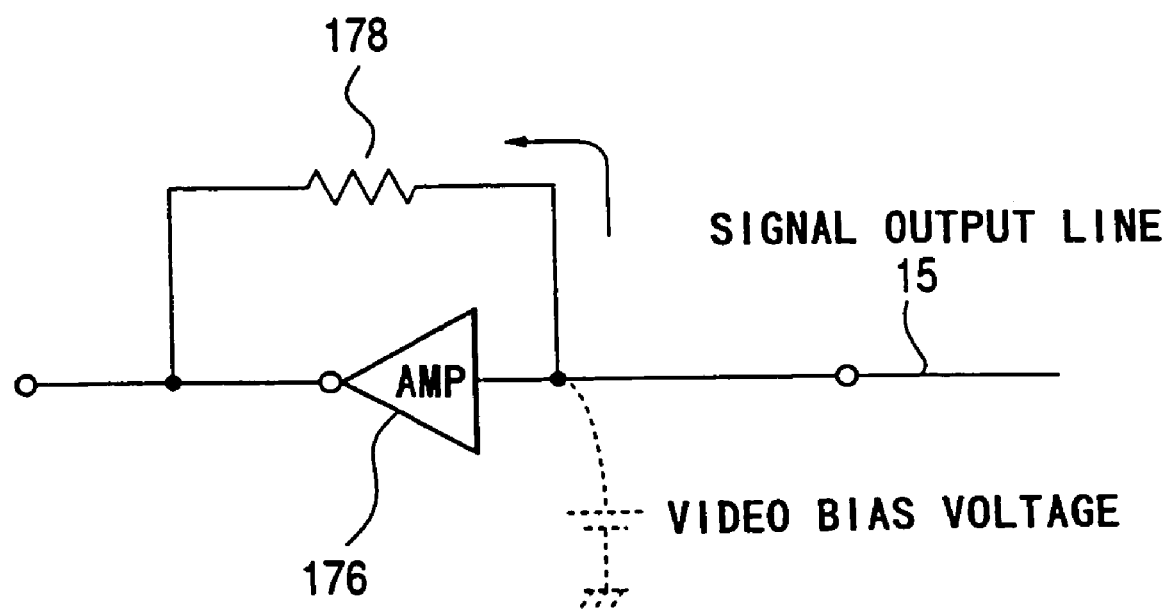
FIG. 39 is a circuit diagram showing a video amplifier connected to a horizontal signal line in a modification of the present invention.

In each noise canceler in each embodiment, since noise decreases as the signal current (only the noise component) read out in the absence of an input signal decreases, the voltage applied to the storage drain power supply terminal is preferably set to be almost equal to a video bias voltage. The video bias voltage is a voltage to which the horizontal signal line 15 is almost fixed when a signal is read out from the horizontal signal line 15 with a current. FIG. 39 shows a modification which realizes this arrangement. An operational amplifier 176 is connected to the output signal line 15, and a load resistor 178 is connected between the input and output terminals of the operational amplifier 176. According to this modification, a signal current is forcibly supplied to the load resistor 178, so that the horizontal signal line 15 is fixed to a virtual voltage, i.e., the video bias voltage.

In each embodiment described above, the unit cells are arranged in the form of a two-dimensional matrix. As is obvious, however, the present invention can be applied to an imaging apparatus having a one-dimensional array of unit cells.

As has been described above, according to the present invention, there is provided an MOS-type solid-state imaging apparatus which can attain a reduction in unit cell size and a reduction in overall apparatus size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

The invention claimed is:

1. An MOS-type solid-state imaging apparatus comprising:
    unit cells arranged in an array;
    a selector configured to select one row of the unit cells;
    selection lines connected to said selector, to which a selection signal is supplied, the selection signal having two levels; and
    vertical signal lines to which outputs from said unit cells in each column are supplied,
    wherein each of said unit cells comprises:
        a photoelectric conversion portion;
        an amplification transistor having a gate to which an output from said photoelectric conversion portion is supplied, a source connected to said vertical signal line, and a drain connected to said selection line; and
        an address capacitor connected between the gate of said amplification transistor and said selection line, and
    wherein a negative pulse is applied to said selection line to forward-bias said photoelectric conversion portion through said address capacitor so as to discharge a signal charge from said photoelectric conversion portion.

2. An MOS-type solid-state imaging apparatus according to claim 1, further comprising a transfer gate circuit connected between said photoelectric conversion portion and the gate of said amplification transistor.

3. An MOS-type solid-state imaging apparatus according to claim 1, further comprising a compensation circuit configured to compensate for variations in amplification characteristics of the amplification transistors of said many unit cells.

4. An MOS-type solid-state imaging apparatus according to claim 3, in which said compensation circuit comprises a noise canceler configured to subtract a noise component from an output from said unit cell.

5. An MOS-type solid-state imaging apparatus according to claim 3, in which said compensation circuit comprises a noise canceler configured to subtract a charge representing a noise component from a charge representing an output from said unit cell.

6. An MOS-type solid-state imaging apparatus according to claim 3, in which said compensation circuit comprises a source follower circuit to which an output signal from said unit cell is supplied, a sample/hold capacitor to which an output signal from said source follower circuit is supplied through a sample/hold transistor and a clamp capacitor, and a clamp transistor connected to a connection point between said sample/hold capacitor and said clamp capacitor to turn on/off the connection point.

7. An MOS-type solid-state imaging apparatus according to claim 6, in which said sample/hold capacitor and said clamp capacitor are stacked on each other.

8. An MOS-type solid-state imaging apparatus according to claim 3, in which said compensation circuit comprises a sample/hold capacitor to which an output signal from said unit cell is supplied through a clamp capacitor and a sample/hold transistor, and a clamp transistor connected to a connection point between said clamp capacitor and said sample/hold transistor to turn on/off said clamp capacitor.

9. An MOS-type solid-state imaging apparatus according to claim 8, in which said compensation circuit comprises a correction circuit configured to reduce a difference between impedances of said clamp capacitor in ON and OFF periods.

10. An MOS-type solid-state imaging apparatus according to claim 9, in which said correction circuit comprises a correction capacitor for increasing a capacitance of said clamp capacitor when said clamp transistor is off.

11. An MOS-type solid-state imaging apparatus according to claim 3, in which said compensation circuit comprises a source follower circuit to which an output signal from said unit cell is supplied, a sample/hold capacitor to which an output signal from said source follower circuit is supplied through a clamp capacitor and a sample/hold transistor, and a clamp transistor connected to a connection point between said clamp capacitor and said sample/hold transistor to turn on/off said clamp capacitor.

12. An MOS-type solid-state imaging apparatus according to claim 3, in which said compensation circuit comprises a slice transistor having a gate to which an output signal from said unit cell is supplied, a slice capacitor and a slice reset transistor which are connected to a source of said slice transistor, and a slice charge transfer capacitor and a drain reset transistor which are connected to a drain of said slice transistor.

13. An MOS-type solid-state imaging apparatus according to claim 3, in which said compensation circuit comprises a sample/hold capacitor to which an output signal from said unit cell is supplied through a sample/hold transistor and a clamp capacitor, and a sample/hold transistor connected to a connection point between said sample/hold capacitor and said clamp capacitor to turn on/off the connection point.

14. An MOS-type solid-state imaging apparatus comprising:
    an imaging region formed by two-dimensionally arranging unit cells serving as photoelectric conversion portions, in the form of a matrix, on a semiconductor substrate;

vertical address lines arranged in a row direction of said imaging region, to which a selection signal is supplied, the selection signal having two levels;

vertical signal lines arranged in a column direction of said imaging region, to which signals read out from said unit cells are supplied;

load transistors each connected to one end of each of said vertical signal lines; and horizontal selection transistors each connected to the other end of each of said vertical signal lines, wherein said unit cell comprises:
- a photodiode serving as a photoelectric conversion portion;
- an amplification transistor having a gate to which an output from said photodiode is supplied, and a source and a drain respectively connected to said vertical signal line and said vertical address line; and
- an address capacitor connected between the gate of said amplification transistor and said vertical address line, and wherein a negative pulse is applied to said vertical address line to forward-bias said photoelectric conversion portion through said address capacitor, thereby discharging a signal charge from said photodiode into said semiconductor substrate.

15. An MOS-type solid-state imaging apparatus according to claim 14, in which a transfer transistor is connected between said photodiode and the gate of said amplification transistor.

16. An MOS-type solid-state imaging apparatus comprising:

an imaging region formed by two-dimensionally arranging unit cells on a semiconductor substrate, each of said unit cells comprising a photodiode, an amplification transistor having a gate to which an output from said photodiode is supplied, an addressing element configured to activate said amplification transistor, and a reset circuit configured to discharge a signal from said photodiode;

vertical address lines arranged in a row direction of said imaging region;

a vertical shift register configured to drive said vertical address lines;

vertical signal lines arranged in a column direction in which currents are read out from said amplification transistors;

load transistors each connected to one end of each of said vertical signal lines;

horizontal selection transistors each connected to the other end of each of said vertical signal lines;

a horizontal selection shift register configured to apply selection pulse signals to gates of said horizontal selection transistors; and a horizontal signal line configured to read out signal currents from said vertical signal lines through said horizontal selection transistors, wherein a cell structure is formed such that a source and a drain of said amplification transistor are respectively connected to said vertical signal line and said vertical address line, an address capacitor is connected between said vertical address line and the gate of said amplification transistor, and a negative pulse is applied to said vertical address line to forward-bias said photodiode through said address capacitor, thereby discharging a signal charge from said photodiode into said semiconductor substrate.

17. An MOS-type solid-state imaging apparatus according to claim 16, in which a transfer transistor is connected between said photodiode and the gate of said amplification transistor.

* * * * *